United States Patent [19]
Watkins et al.

[11] Patent Number: 5,467,091
[45] Date of Patent: Nov. 14, 1995

[54] RADAR AND OTHER COMMUNICATION SYSTEMS HAVING LARGE BANDWIDTH AND LARGE DYNAMIC RANGE

[75] Inventors: Grant H. Watkins, Dunkirk; Stephen P. Caldwell, Columbia, both of Md.

[73] Assignee: Westinghouse Electric Corp., Baltimore, Md.

[21] Appl. No.: 278,214

[22] Filed: Jul. 21, 1994

[51] Int. Cl.$^6$ ................................................. G01S 13/524
[52] U.S. Cl. ........................... 342/159; 342/99; 342/100; 342/101; 342/161; 342/162
[58] Field of Search ............................ 342/159, 98, 99, 342/100, 101, 160, 161, 162

[56] References Cited

U.S. PATENT DOCUMENTS

| | | | |
|---|---|---|---|
| 3,676,684 | 7/1972 | De Lange | 359/133 |
| 3,984,675 | 10/1975 | Corcoran et al. | 359/244 |
| 4,725,786 | 2/1988 | Papaieck | 327/105 |
| 4,866,466 | 9/1989 | Hellsten | 342/25 |
| 5,155,741 | 10/1992 | Waters et al. | 375/200 |
| 5,166,629 | 11/1992 | Watkins et al. | 328/14 |
| 5,235,455 | 8/1993 | Berry et al. | 359/276 |
| 5,339,187 | 8/1994 | Nelson | 359/182 |
| 5,374,903 | 12/1994 | Blanton | 331/4 |

*Primary Examiner*—John B. Sotomayor

[57] ABSTRACT

A large bandwidth communication system has a transmitter to transmit signals over a selectable frequency operating range and a receiver having a first mixer for mixing an LO1 signal with received transmit signals. The receiver has a first IF for processing signals received from the first mixer. A frequency synthesizer generates frequency signals for application to at least a transmit mixer in the transmitter and to at least the first mixer in the receiver. A computer system selects and applies a modified frequency value to at least one of plural frequencies used in the system that of the LO1 signal applied to the first mixer, that of a frequency signal applied to the transmit mixer, and an IF frequency of the first IF, with the modified frequency value selected as a function of the system operating frequency and stored spurious amplitude data so as to sidestep spurious signals in portions of the total system frequency operating bandwidth where spurious amplitudes are excessive and otherwise would interfere with quality reception.

43 Claims, 20 Drawing Sheets

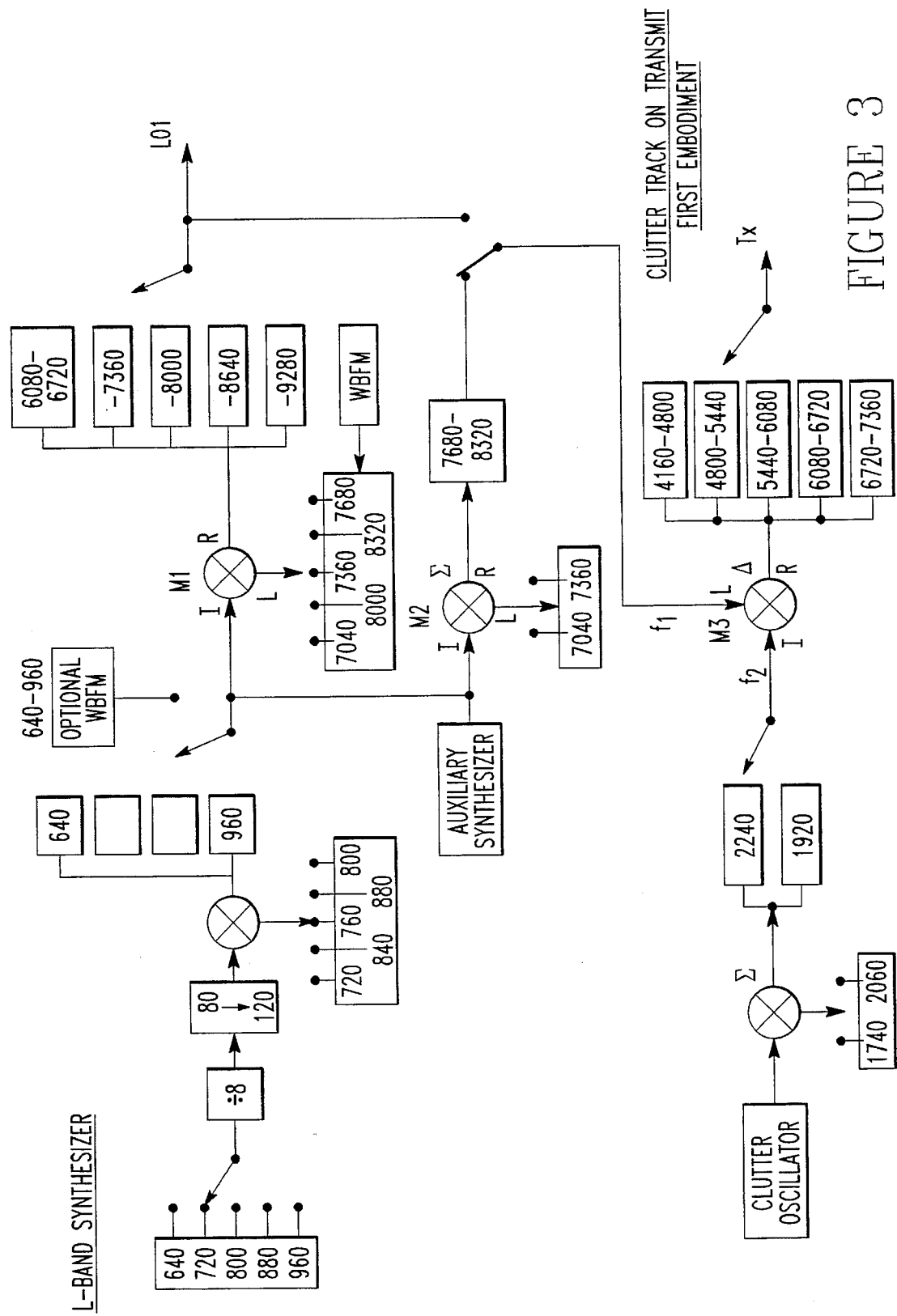

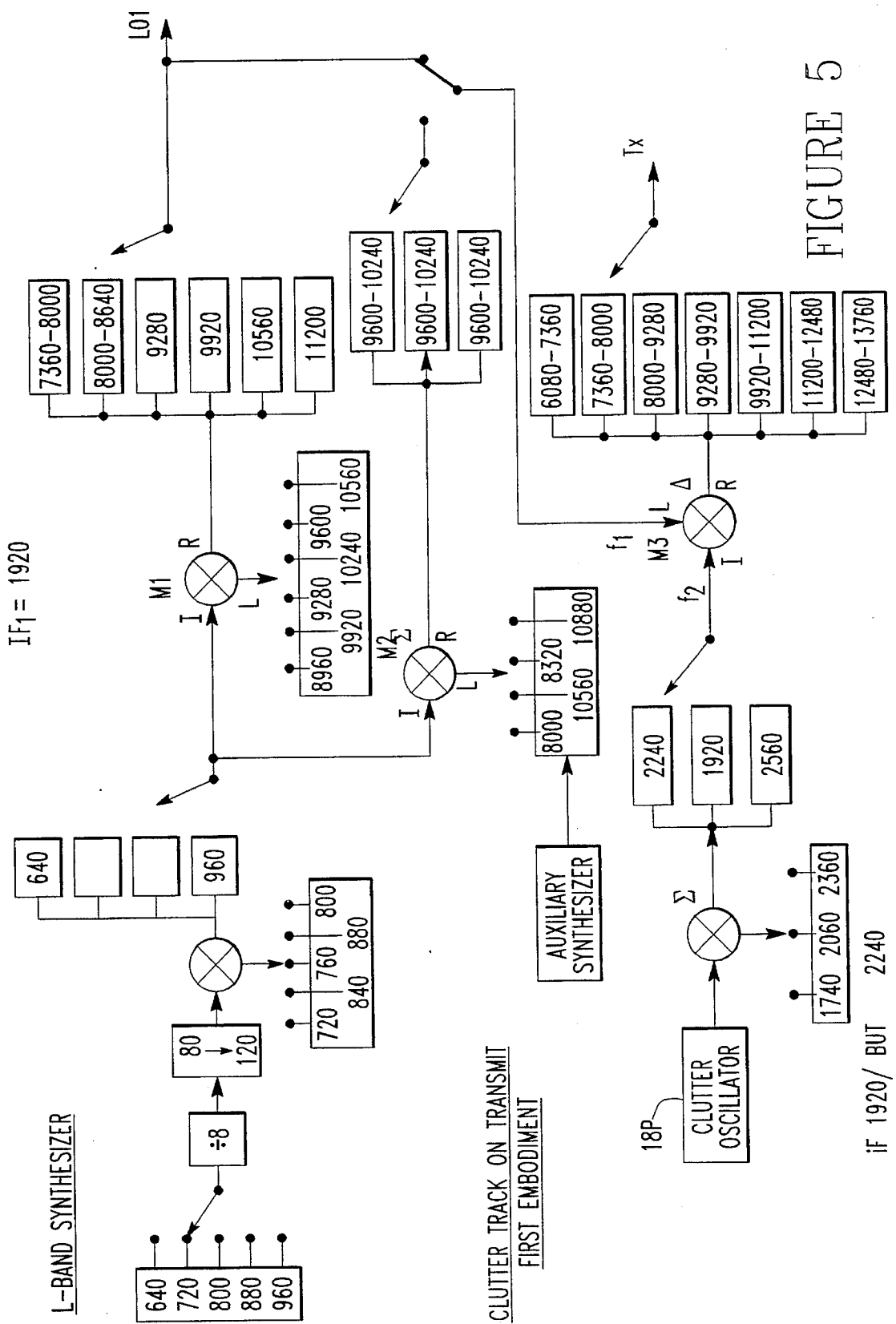

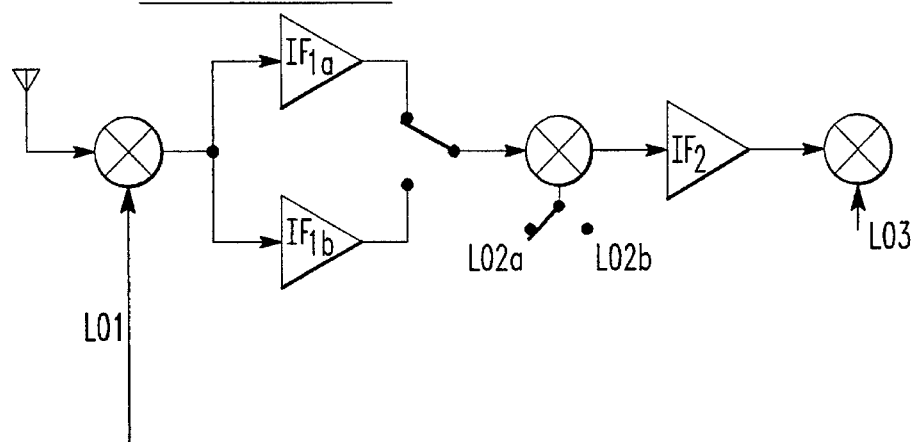
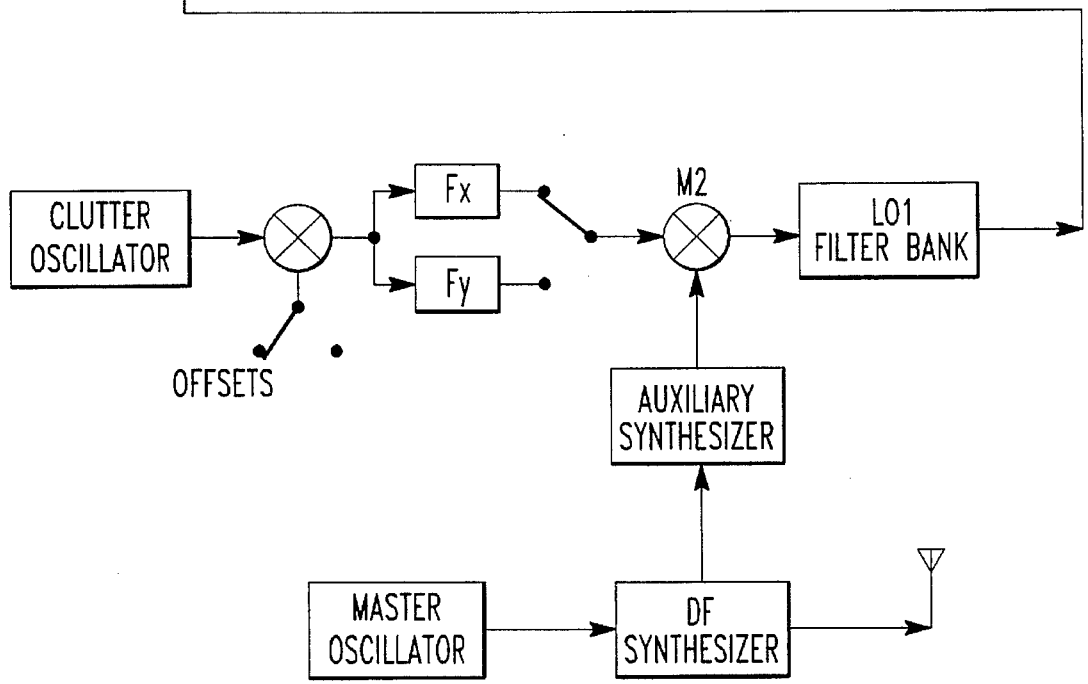
FIGURE 15

RADAR AND OTHER COMMUNICATION SYSTEMS HAVING LARGE BANDWIDTH AND LARGE DYNAMIC RANGE

BACKGROUND OF THE INVENTION

The present invention relates to communication systems and more particularly to pulse doppler radar systems having large bandwidth with large dynamic range.

The maximum bandwidth of communication systems has generally been limited to a spurious-free frequency band over which transmitted communication signals can be received for processing by a receiver, and transmitted spurious signals (spurs or birds) and receiver generated birds are substantially excluded from receiver processing. As a result, communication systems have generally had a smaller bandwidth than that which is desirable for better system operation.

In airborne pulse doppler radar systems, maximum bandwidth has generally been design limited to about 3 or 4 GHz. However, much wider bandwidth is desirable to provide greater flexibility to radar operators in identifying targets or avoiding jamming.

State-of-the-art airborne radar systems, or ground based radar systems having a clutter tracking function, are mechanized so that all stable local oscillator (STALO) frequency signals, except one, are harmonically related to a single master oscillator. Hence, spurious mixing products are also harmonically related to the master oscillator frequency. However, the one exception is a clutter tracking frequency signal which is unrelated harmonically to the master oscillator signals, and, accordingly, has caused problems that have limited system bandwidth in the prior art as described above. Thus, one or more harmonics of the clutter tracking signal can fall near a transmit frequency signal or near a receiver LO1 frequency signal and thus can be processed by the receiver and appear to be one or more false targets.

A clutter tracking function is required in the operation of airborne pulse doppler radar systems, and may be required in stationary ground-base pulse doppler radar systems, to enable ground clutter returns to be tuned for removal from receiver processing. A clutter frequency signal is generated to correct for doppler shift of ground clutter returns and such use of the clutter frequency signal is referred to as dithering.

The clutter function is typically provided in the transmitter. However, the clutter frequency signal can be generated by dithering either the transmit frequency signal or one of the receiver LO frequency signals so that radar ground clutter returns are positioned in a receiver notch filter and thus cannot be processed as false radar target returns.

Ground based, coherent doppler or moving target indicator (MTI) radars may also require a clutter oscillator, and such radars have nonetheless had limited frequency ranges of operation for reasons similar to those described for the airborne pulse doppler radar systems.

Even in pulse doppler radar systems which have no dithering function, there can be many regions in the receiver first mixer and in the transmit mixer which have bird problems. The use of a dithering function, as described above, makes the bird problems much more severe and harder to resolve. System requirements determine how difficult particular bird problems are in each system design.

When prior art attempts have been made to provide larger radar bandwidths, the problem of dealing with the clutter tracking harmonics has been especially severe because many regions of the total LO1/transmit frequency band are harmonically related to the clutter track frequency. In the prior art, spurious or bird signals, which stem from the clutter oscillator, fall in these regions without blockage. This bird problem is the principal reason that bandwidth has been limited in prior art pulse doppler radar systems.

Direct frequency (DF) synthesizers have been available to generate frequency signals over very broad ranges, such as 3 GHz to 20 GHz. A direct frequency synthesizer suitable for wideband operation is disclosed in U.S. Pat. No. 5,166,629, entitled "Direct Frequency Synthesizer", and issued to G. Watkins et al. on Nov. 24, 1992. However, such DF synthesizers have not been able to be used to greatest advantage in prior art pulse doppler radar systems since such radar systems have had a limited bandwidth as described above.

Further, in general, communication systems have been similarly limited in bandwidth as a result of the presence of birds in many regions of the possible total transmit frequency band. As in the specific case of pulse doppler radar systems, other communication systems may or may not employ dithering, and in either case be characterized with significant bird problems that limit system bandwidth unless they are resolved.

Spread spectrum communication systems, for example, have a need for use of an ultra wide band of frequencies to send high volumes of data. Especially under congested band conditions, broad band operation is needed to provide flexibility for operating at frequencies where there is least interference and optimum atmospheric conditions. Further, to avoid unwanted interception of sensitive communications by an undesired party, frequency is desirably changeable over a large bandwidth to frequencies known only by the intended parties. In order to avoid jamming by an undesired party, frequency may also be changed rapidly, desirably over a large band of frequencies.

While there are certain significant differences, there is some similarity between broad band radar systems and spread spectrum communication systems. To obtain a stronger target return, a radar system uses several frequencies so that degradation due to atmospheric conditions and target resonance with respect to radar wavelength can be avoided. The radar system selects frequencies where there is less interference from any neighboring radars. Similarly, the communication system selects different frequencies to adjust to atmospheric and sunspot conditions and to interference conditions.

Receivers in both systems are susceptible to the generation of undesired intermodulation products in the first mixer. In the case of radar systems, such products are generated by strong ground clutter returns or jammers or other radars. In the case of spread spectrum communication systems, such products are generated by jammers or other communication systems.

Both radar systems and spread spectrum communication systems require a receiver and a transmitter. When manufactured by a common manufacturer, both systems are usually designed with as much common hardware as possible to optimize cost and performance. The radar receiver employs a variable frequency LO for its first mixer, and the communication receiver employs a variable frequency LO for its first mixer. The radar transmitter employs a variable output frequency which tracks its receiver, and the spread spectrum communication system has an identical requirement. In the process of generating the transmit frequency for either system, spurious mixer regions are encountered as the receiver first LO signal is mixed with an offset signal having a frequency which is equal to the frequency of the receiver first IF, to generate the transmit signal with a frequency that is variable over a broad band.

The large ground clutter returns associated with airborne radars create a unique problem which must be overcome. These returns overload the signal processing circuits if they are not filtered out by dithering a receiver LO frequency or the transmit frequency so that such returns fall in a narrow notch filter. Similar problems of a less severe nature can be encountered in ground based radars from ground returns from trees which blow in the wind, and dithering such returns into a notch filter can be required.

In communication systems, it may be necessary to offset the received frequency from the transmit frequency by several Khz to notch out a strong interfering signal. Hence, a similar dithering function is required. Most radio amateur communication transceivers have such a feature.

Whether a dithering function is required in air or ground based radar systems or other communication systems which are attempted to be operated over a broad band of frequencies, there are bad spurious mixing regions in both the transmitter mixer and the receiver first mixer. Accordingly, prior art radar and other communication systems have generally been limited in capability to handle birds in such spurious regions and have therefore been disadvantageously limited in bandwidth.

SUMMARY OF THE INVENTION

The present invention is directed to a radar or other communication systems in which bird signals are effectively avoided in receiver and transmitter operation thereby enabling significantly extended system bandwidth.

In accordance with the invention, a large bandwidth communication system comprises a transmitter system for generating transmit signals over a selectable frequency operating range and a receiver system having a first mixer for mixing an LO1 signal with received transmit signals. The receiver system has a first IF system for processing signals received from the first mixer.

A frequency synthesizer system generates frequency signals for application to at least a transmit mixer in the transmitter and to at least the first mixer in the receiver. A control system selects and applies a modified frequency value for at least one of plural frequencies including that of the LO1 signal applied to the first mixer, that of a frequency signal applied to the transmit mixer, and an IF frequency of the first IF system, with the modified frequency value selected as a function of the system operating frequency and stored spurious amplitude data to sidestep spurious signals in portions of the total system frequency operating bandwidth where spurious amplitudes are excessive and otherwise would interfere with quality reception.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate a preferred embodiment of the invention and together with the description provide an explanation of the objects, advantages and principles of the invention. In the drawings:

FIGS. 3–5 show respective examples of the first embodiment of FIG. 2A with specific values indicated for system filters and with use of the auxiliary synthesizer with clutter tracking on transmit and fixed $IF_1$ in the receiver;

FIG. 15 shows a variation of the second and third embodiments employing a dual IF receiver with clutter tracking done on the receiver LO1 with an auxiliary synthesizer required.

BEST MODE FOR CARRYING OUT THE INVENTION

The present invention provides a high dynamic range radar or other communication system over very large bandwidth, i.e., over many GHz.

Figure 1A:
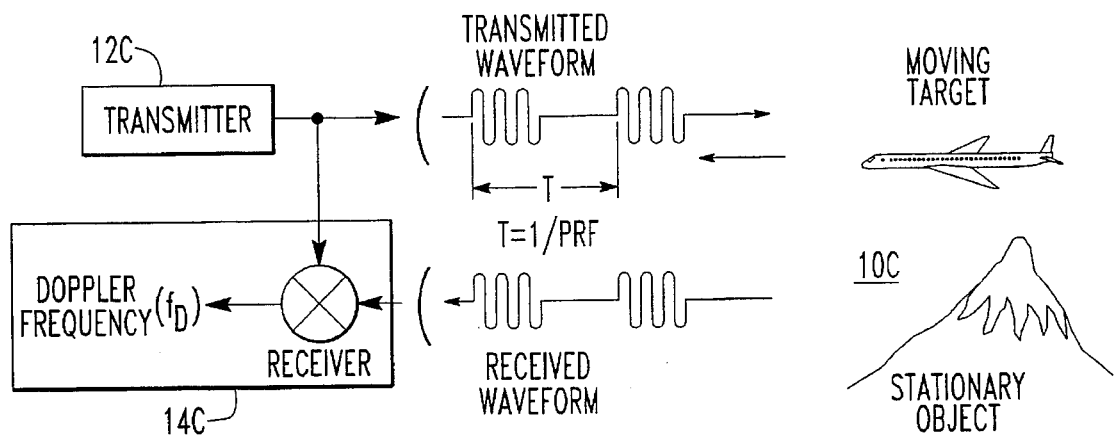
FIG. 1A is a schematic diagram that illustrates the operation of a pulse doppler radar system.

A pulse doppler radar system 10C is generally illustrated in FIG. 1A to provide a basic understanding of the manner in which such systems operate. Thus, a transmitter 12C generates a transmitted waveform comprising a carrier which is pulsed at a pulse rate frequency (PRF). The time period between successive pulses is T which equals 1/PRF.

A moving object, such as the illustrated airplane, reflects a signal to a receiver 14C. Ground clutter signals are also returned to the receiver 14C from stationary objects such as the illustrated mountain. The received radar waveform is mixed with the transmitted waveform to produce a waveform having the doppler shifted frequency $f_d$ from which the object speed can be computed.

Figure 1B:
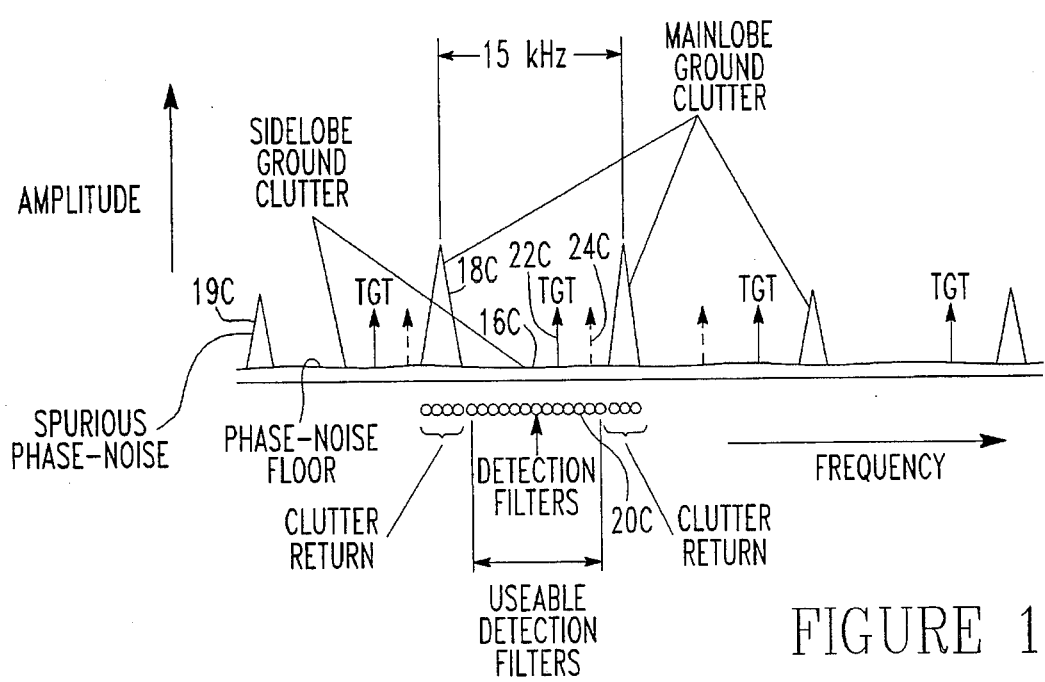
FIG. 1B shows a return signal for the radar of FIG. 1A with signal amplitude plotted as a function of frequency.

In the graph of FIG. 1B, the amplitude of radar received signals is plotted as a function of frequency. Thus, over the bandwidth illustrated, sidelobe clutter 16C (grass) exists over the entire bandwidth. Mainlobe ground clutter signals 18C are blocked from receiver processing by detection filters 20C.

A target signal 22C is passed by the filters 20C for processing. In the prior art, bird signals, such as signal 24C, may also be passed by the filters 20C, in cases where an attempt is made to design the prior art radar to operate over a bandwidth that embraces the illustrated portion of the frequency spectrum.

Figure 1C:
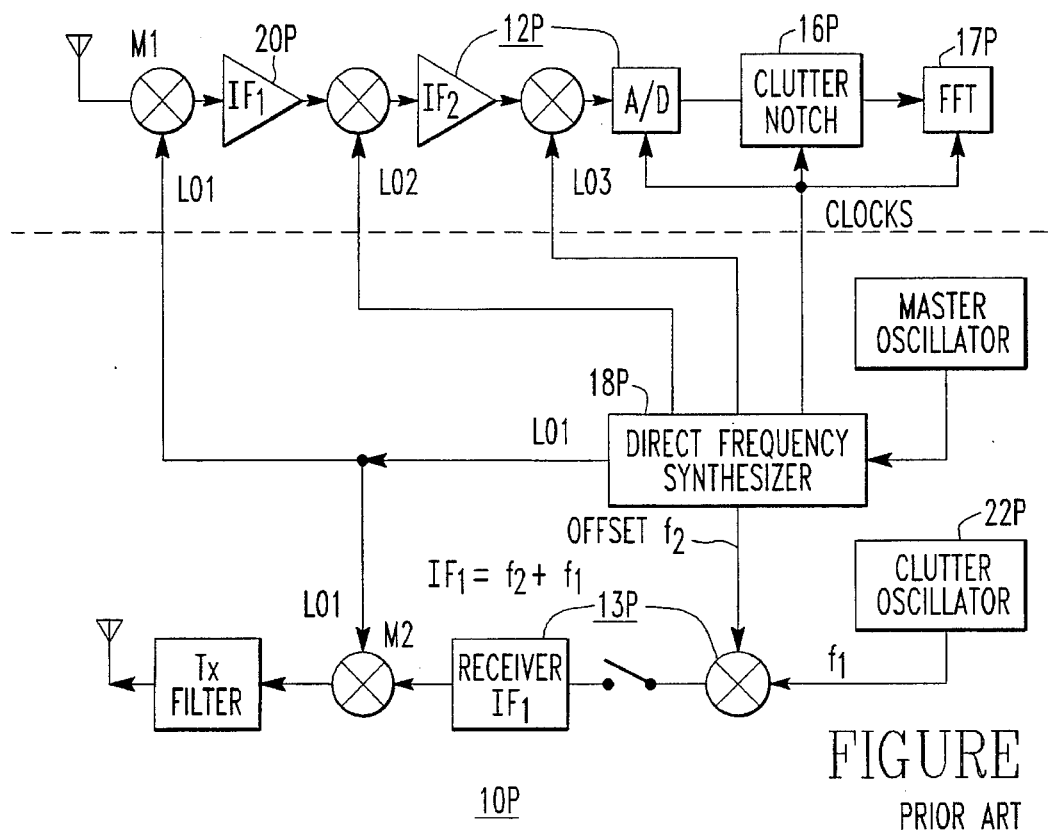
FIG. 1C is a schematic diagram of a typical prior art doppler radar system.

FIG. 1C shows a block diagram of a receiver/transmitter for a conventional pulse doppler radar system 10P. A receiver portion of a triple conversion receiver 12P is followed by an A/D converter, clutter notch filter 16P and a fast Fourier transform (FFT) filter 17P which measures the doppler frequency of the target return. A direct frequency synthesizer 18P provides a broad band variable frequency LO1 to a receiver first mixer M1. The transmit frequency is formed by summing the receiver signal LO1 with a frequency equal to $IF_1$ of a receiver first IF 20P. The $IF_1$ signal can be dithered by a frequency $F_1$ from a clutter oscillator 22P. FIGS. 9–12 shows additional prior art examples that are described in Appendix II.

The main bandwidth limiting problem in the prior art doppler radar system 10P is that, over a large operating transmitter band, spurious or bird frequencies are generated in mixer M2 of transmitter portion 13P which appear at the transmitter output, and spurious or bird frequencies can be generated in the receiver first mixer M1 which can thus appear in the receiver first IF. The present invention resolves this and other similar problems.

Figure 2A:
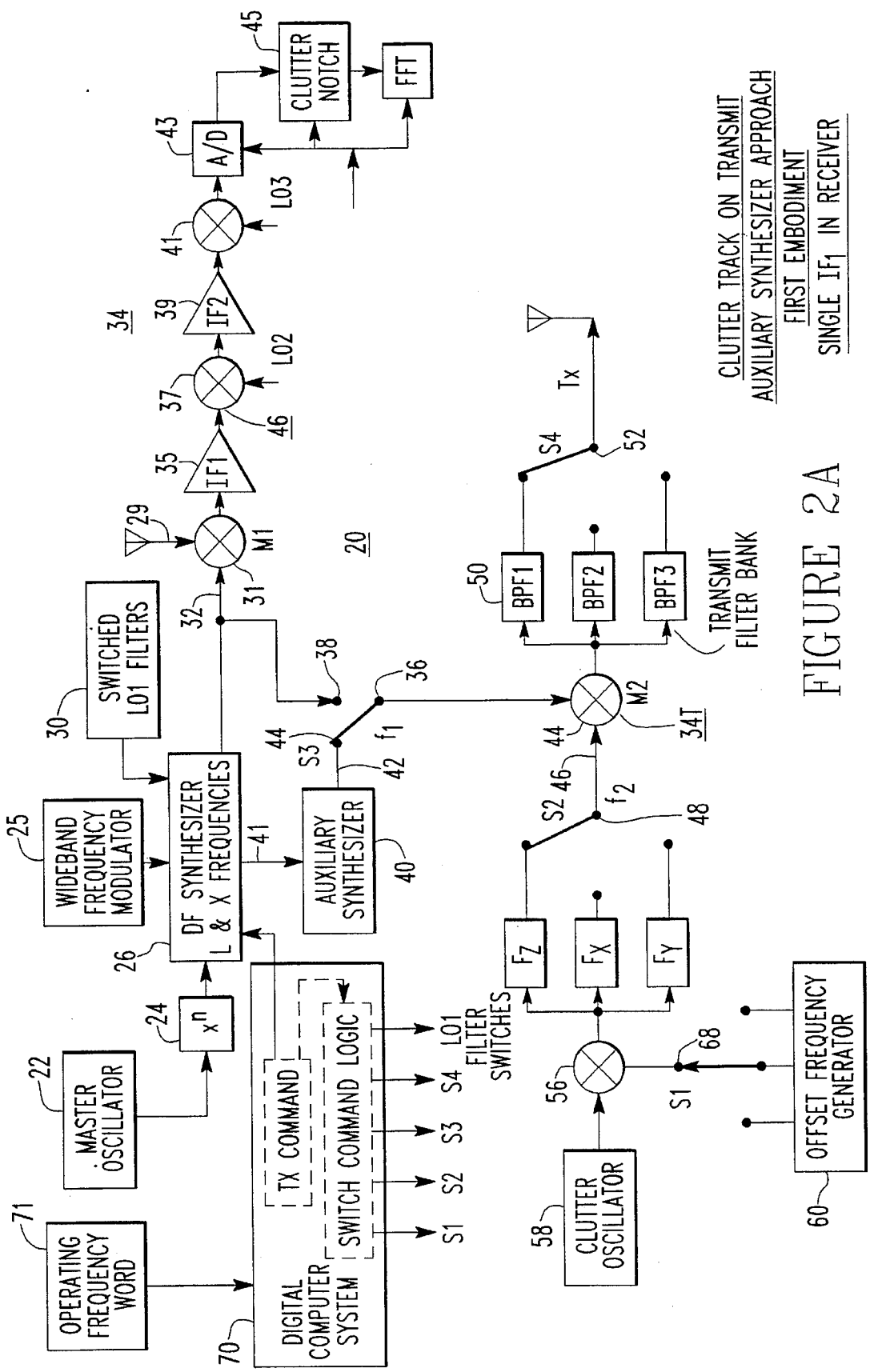
FIG. 2A shows a schematic diagram for a first embodiment of the invention in which a pulse doppler radar system has a clutter track function in a system transmitter and transmit birds are sidestepped with an auxiliary synthesizer.

In FIG. 2A, a first embodiment of the invention is provided in the form of a pulse doppler radar system (PDR) 20. Broader aspects of the invention are applicable to other types of radar systems, and, more generally, to other types of communication systems.

The PDR 20 includes a master oscillator 22 having a frequency stable output applied to a multiplier 24. In the multiplier 24, the master frequency is multiplied by a factor N and applied to an input of a direct frequency (DF) synthesizer 26.

A wide-band FM modulator 25 is coupled to the DF synthesizer 26 to provide FM modulation, if required.

The DF synthesizer 26 is controllable to produce output frequency signals over a wide band so that the PDR 20 can operate over a large frequency range such as 3 GHz–20 GHz or more. For example, an X frequency band of the DF synthesizer 26 may be 9.6 GHz to 16.0 GHz.

The frequency bandwidth of a specific product design for the PDR 20 is dependent on design specifications which are implemented in the PDR 20 through selection of filter, frequency, and other parameters for elements of the PDR 20. In other words, the PDR 20 embodies the invention so that the PDR 20 is capable of operating over a bandwidth specified by design within a large achievable bandwidth, such as 3 GHz–20 GHz or more, which far exceeds the bandwidth capabilities of prior art systems. The same is true for other embodiments of the invention.

The DF synthesizer generates an L frequency band as well as an X frequency band, and it has outputs including an output signal 28 coupled to LO1 filters 30 that are switched under computer control to generate an LO1 signal 32. The illustrated switched filters are part of the DF synthesizer at X-Band. In turn, the signal 32 is applied to an M1 mixer 33 where it is mixed with return signals 29 in receiver processing circuitry 34 of the PDR system 20. The radar return signals are processed by the receiver 34 to identify targets.

The receiver 34 is generally structured like the prior art receiver 12P (FIG. 1C), i.e., the mixer 33 is coupled to an $IF_1$ 35. In turn, the $IF_1$ 35 is coupled to circuitry including in sequence a second mixer 37, an $IF_2$ 39, a third mixer 41, an analog-to-digital converter 43, and a ground clutter filter 45. $IF_1$ provides a constant frequency in the receiver 34.

In the first embodiment of the invention, the LO1 signal 32 is also applied to a terminal 38 of an S3 switch 36 for use in a transmitter 34T of the PDR system 20 in accordance with the invention. An auxiliary synthesizer 40 generates another signal output 42 which is driven by an X band frequency to have a fixed frequency increment offset from the LO1 frequency.

The output signal 42, having a frequency $F_1$ is applied to another terminal 44 of the S3 switch 38, ultimately for the purpose of sidestepping birds to enable large bandwidth operation of the PDR 20. The auxiliary synthesizer 40 can be a separate unit that has a frequency signal 41 applied to its input from the DF synthesizer 26, as shown, or the auxiliary synthesizer 40 can be an integrated portion of the DF synthesizer 40.

In the illustrated case, the auxiliary L-band synthesizer 40 is similar to, and simpler than, the main L-band synthesizer 26. It shares frequencies at the I and L ports with those of the main synthesizer, and output filters are similar to those of the main synthesizer. Both synthesizers are preferably designed in accordance with the aforementioned U.S. Patent. If desired, frequencies can be chosen so that the receiver frequency $IF_1$ is never generated directly, but hardware complexity is increased in that case.

In the transmitter 34T, the switch S3 is operated under computer control to apply the LO1 signal 38 or the auxiliary synthesizer signal 42 to a mixer 44 where it is mixed with a dithered clutter signal 46 having a frequency $f_2$ from an S2 switch 48. The mixer 44 generates an output frequency signal which is applied to a band pass filter bank 50, which, in this case, includes three filters BPF1, BPF2, and BPF3. The number of such filters is dependent upon the design bandwidth of the PDR 20, i.e., greater bandwidth requires more filters.

An S4 switch 52 is operated under computer control to connect one of the band pass filters to the transmitter. The frequency of the transmit signal Tx less the LO1 frequency equals the first $IF_1$ frequency of the PDR receiver 34, where the receiver has a single first $IF_1$ frequency as opposed to multiple first $IF_1$ frequencies. The output frequency signal Tx equals the sum of LO1 and $f_2$.

In accordance with the invention, the switch 48 is operated under computer control to conduct a dithered clutter frequency signal having a frequency $f_2$ from a filter $F_2$, Fx, or Fy to the mixer 44. In turn, a mixer 56 mixes input signals from a clutter oscillator 58 and an offset frequency generator 60 to generate a dithered clutter oscillator signal for input to the band pass filters $F_2$, Fx, and Fy. Normally, the frequency $f_2$ is equal to $F_2$ which is equal to $IF_1$.

The clutter oscillator 58 generates a variable frequency signal (such as one tunable in the range 15 to 100 KHz) that enables ground clutter returns to be blocked from receiver processing by notch filtering. The offset frequency generator 60, in this case, generates three different output frequency signals that are respectively applied to terminals 62, 64, and 66 of an S1 switch 68 which is operated under computer control to select the offset frequency signal applied to the mixer 56. The offset frequency is selected to dither the clutter frequency for ultimate blocking of ground clutter birds in the PDR receiver 34.

Even in pulse doppler radar or other communication systems which have no dithering or similar function, there can be many regions in the receiver first mixer and in the transmit mixer which have bird problems, and the invention can provide for sidestepping these troublesome birds and thereby enable large bandwidth. The use of a dithering function, as described above, makes the bird problems much more severe and harder to resolve, yet the invention resolves these more difficult bird problems as well. System requirements determine how difficult particular bird problems are in each system design.

A programmed digital computer 70 receives an operator generated frequency word 71 from which the settings of the various switches are defined. The computer 70 is coupled to the switches S1, S2, S3, and S4 to control the switch positions to achieve bird sidestepping that enables large bandwidth operation of the PDR 20. In addition, the computer 70 is coupled to the DF synthesizer 26 to define the L and X band frequencies to be generated for the PDR 20.

Among other system functions, the computer 70 operates the switches S1, S2, S3, and S4 in accordance with logic that enables clutter oscillator birds to be sidestepped or avoided in the operation of the PDR 20.

The logic switching commands generated by the computer are based on the design of the receiver, transmitter, and signal processor in each particular system and by particular specifications for the system. Generally, whenever the bird level exceeds a predetermined threshold, which is determined by system requirements, the frequency switches are operated to change the frequency combination which determines the transmit frequency so that the bird level is reduced to an acceptable level. Thus, in the embodiment of FIG. 2A, the switches S1, S2, S3 and S4 are operated in unison as controlled by stored logic to sidestep excessive birds.

Figure 2B:
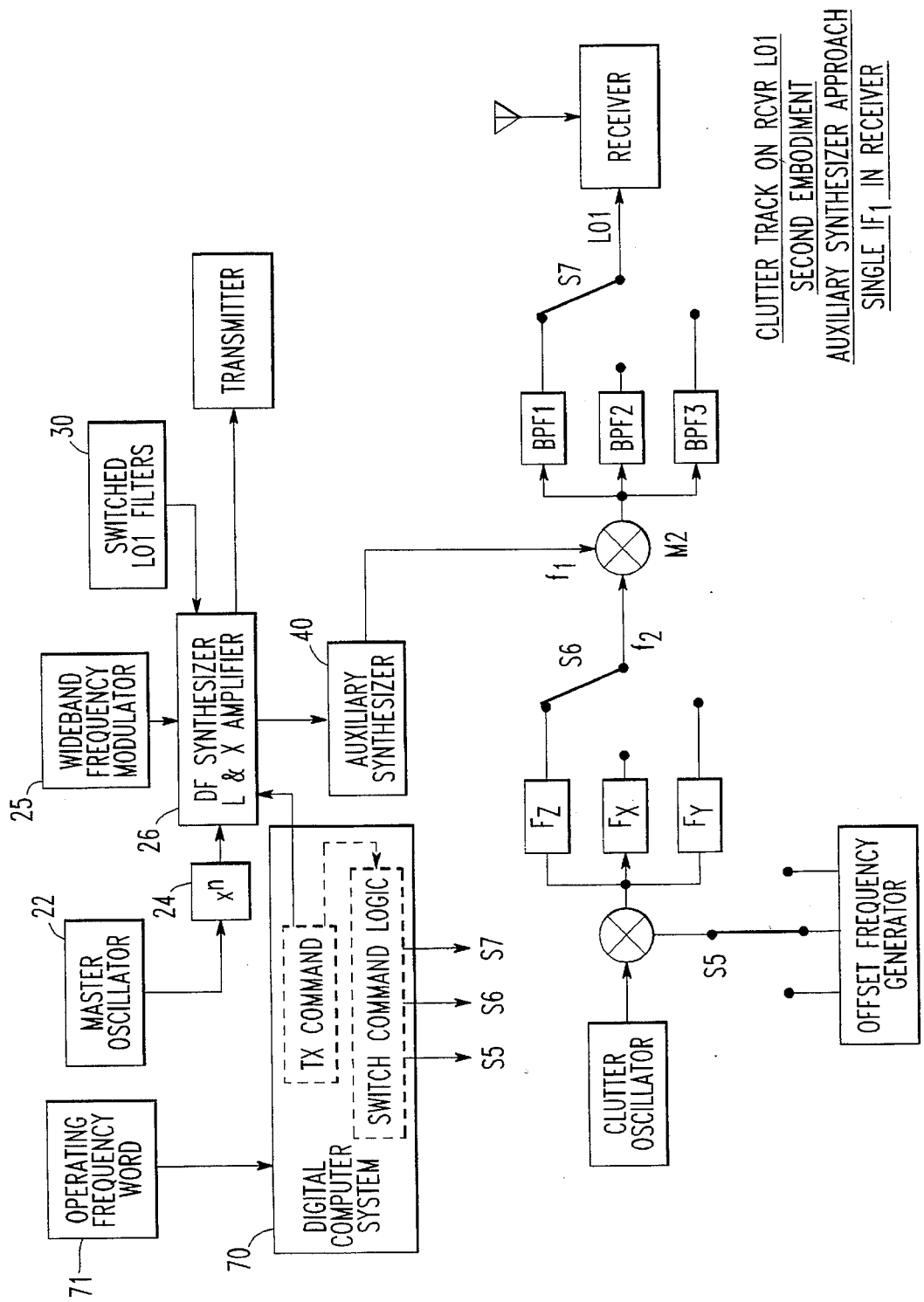
FIG. 2B is a schematic diagram for a second embodiment of the invention in which a pulse doppler radar system has a clutter track function in a system receiver with one $IF_1$ unit, and clear LO1 with clutter tracking is generated using the auxiliary synthesizer.
Figure 2C:
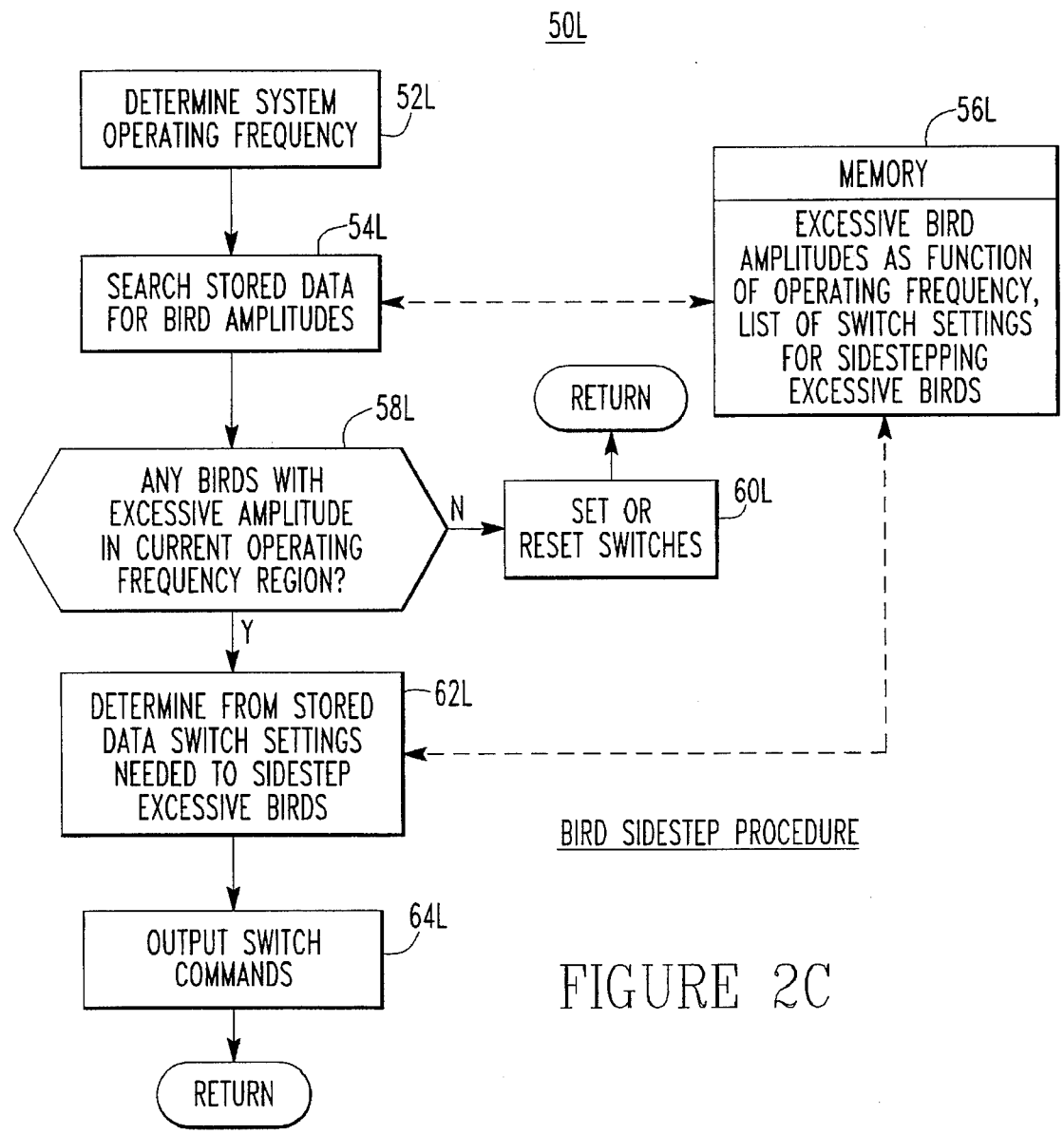
FIG. 2C is a functional block design representing computer logic employed to side step birds in accordance with the invention.

More particularly, as shown in the functional block diagram in FIG. 2C, switch operation is controlled by a procedure 50L executed in the computer 70. In the procedure 50L, the known system operation frequency is determined in block 52L. Next, block 54L searches a memory 56L for stored bird amplitude data.

The memory 56L lists excessive bird amplitudes relative to operating frequency regions. In other words, when the system is designed, birds are identified from bird charts in accordance with the receiver first IF frequency and the transmit frequency. In turn, a list is made of operating frequency regions in which such birds have excessive amplitude.

The excessive bird list is stored in the memory 56L as previously indicated. In addition, switch settings are specified for each excessive bird region so that transmit frequencies are changed to sidestep the bird(s) in the excessive bird region(s).

In the absence of excessive birds, as detected by test block 58L, the switch settings are set or reset to normal settings as indicated by block 60L. If the test block 58L finds one or more excessive bird amplitudes, block 62L determines settings for the switches S1, S2, S3 and S4 from the memory 56L needed for bird sidestepping. Block 64L then outputs corresponding switch commands, and the switches S1, S2, S3 and S4 are set to produce system operation substantially free of bird interference over the system design bandwidth. As already indicated, the invention enables the design bandwidth to be very large.

In overall operation of the embodiment of FIG. 2A, the transmit frequency is generated over portions of the transmit band by summing LO1 with a clutter frequency equal to the receiver $IF_1$. Over these portions of the total band, clutter track spurious do not fall in the LO1 and transmit band of use. During receive operation, the clutter frequency is snuffed off. Over those portions of the total band in which spurious $IF_1$ fall into either the Tx or LO1 band, the clutter offset frequency is changed, and summed with a frequency from the auxiliary L-band synthesizer 40 to form the desired transmit frequency without the undesired spurious.

By employing a receiver with a constant $IF_1$, the technique employed in the first embodiment allows very low spurious performance to be achieved over a very large bandwidth with minimal hardware complexity. Hence, a very large dynamic range radar system can be realized.

In an embodiment in which no clutter function is provided the system 20, for example, would employ a fixed frequency in place of the variable clutter oscillator 58, offset generator 60, switch 52, etc., and sidestepping of mixer M2 birds is provided by control of the switch 53 to change $f_1$ when a bad bird region is realized.

FIG. 3 shows an example of the invention for a receiver $IF_1$= 1920 and transmit band of 4160 to 7360. The third harmonic of $IF_1$, 5760 falls in the middle of the 5440–6080 transmit band; and the fourth harmonic of $IF_1$, 7680, falls in the middle of the corresponding LO1 band: 7360–8000. Therefore, over the transmit band from 5440 to 6080, the output 7680–8320 from the auxiliary synthesizer is subtracted from a clutter frequency of 2240. In this case, the auxiliary synthesizer consists of a mixer, M2, and a single output filter; it shares frequencies of 7040 and 7360 with the main synthesizer.

Figure 4:
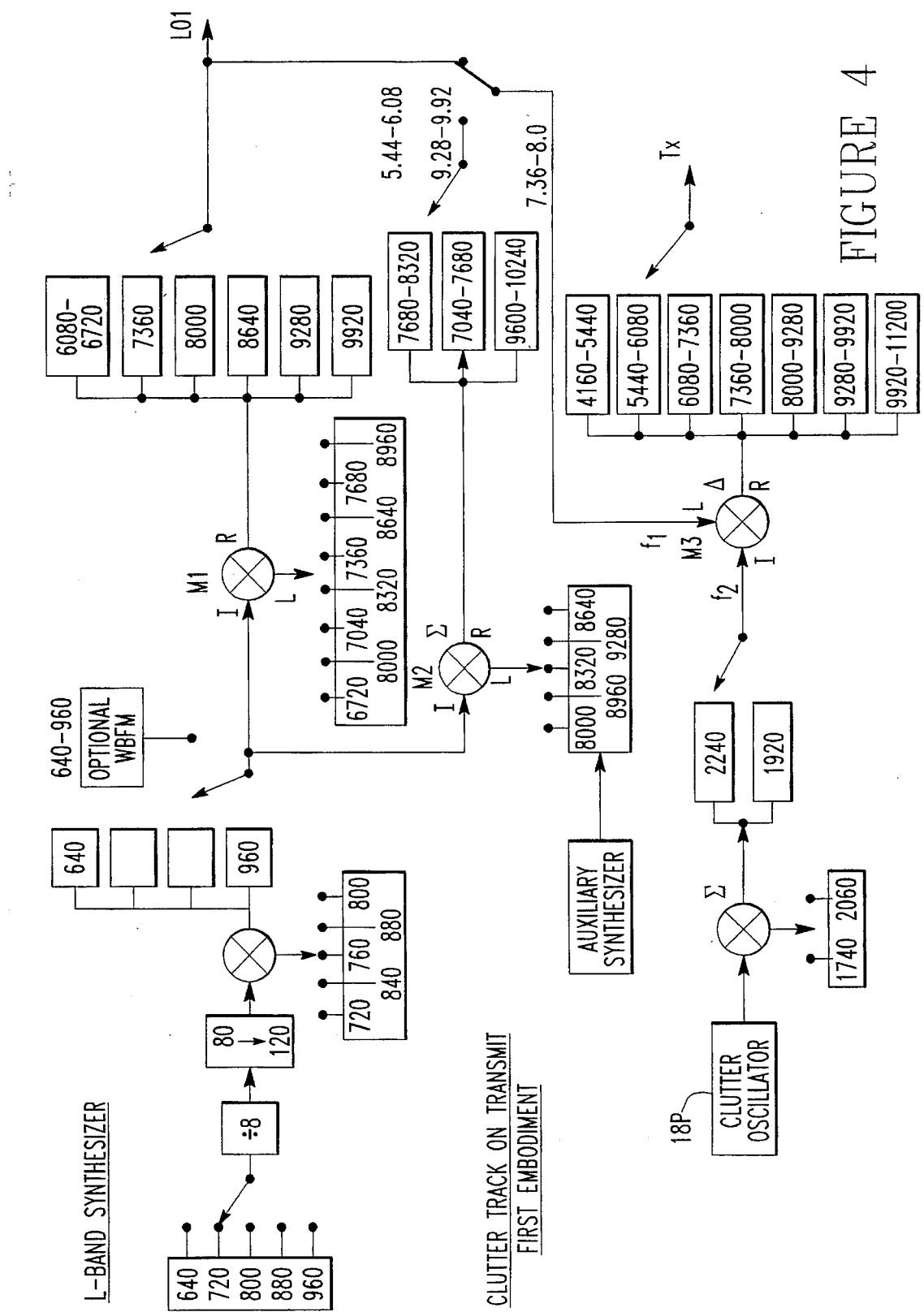

FIG. 4 shows the embodiment of FIG. 3 extended over the Tx band from 4160 to 11200 with two clutter offset frequencies for $f_2$ and seven output filters for M3.

FIG. 5 shows an embodiment of the invention for a transmit band from 6080 to 13120 using seven transmit output filters and three clutter frequencies for $f_2$. The auxiliary synthesizer has three output filters.

If desired, the basic concepts of the invention can be applied so that $IF_1$ is never generated directly. Such operation is needed if the clutter tracking function is placed in the receiver LO1, as shown in a second embodiment in FIG. 2B, instead of in the transmitter as shown in FIG. 2A, because the clutter tracking frequency would appear in the receiver $IF_1$ while the receiver is functioning.

The second embodiment of the invention (FIG. 2B) generally employs concepts similar to the concepts applied in FIG. 2A. The transmit frequency is formed directly by the DF synthesizer. The receiver LO1, with clutter tracking, is formed by mixing the auxiliary synthesizer with clutter frequencies Fx, Fy, or Fz. Hence, the receiver LO1 is spur free because spurs can be avoided in M2. As in the first embodiment, sidestepping is provided for M2 mixer birds with or without the use of illustrated clutter oscillator. In the absence of the clutter oscillator, a fixed frequency signal replaces such clutter oscillator.

Figure 6A:
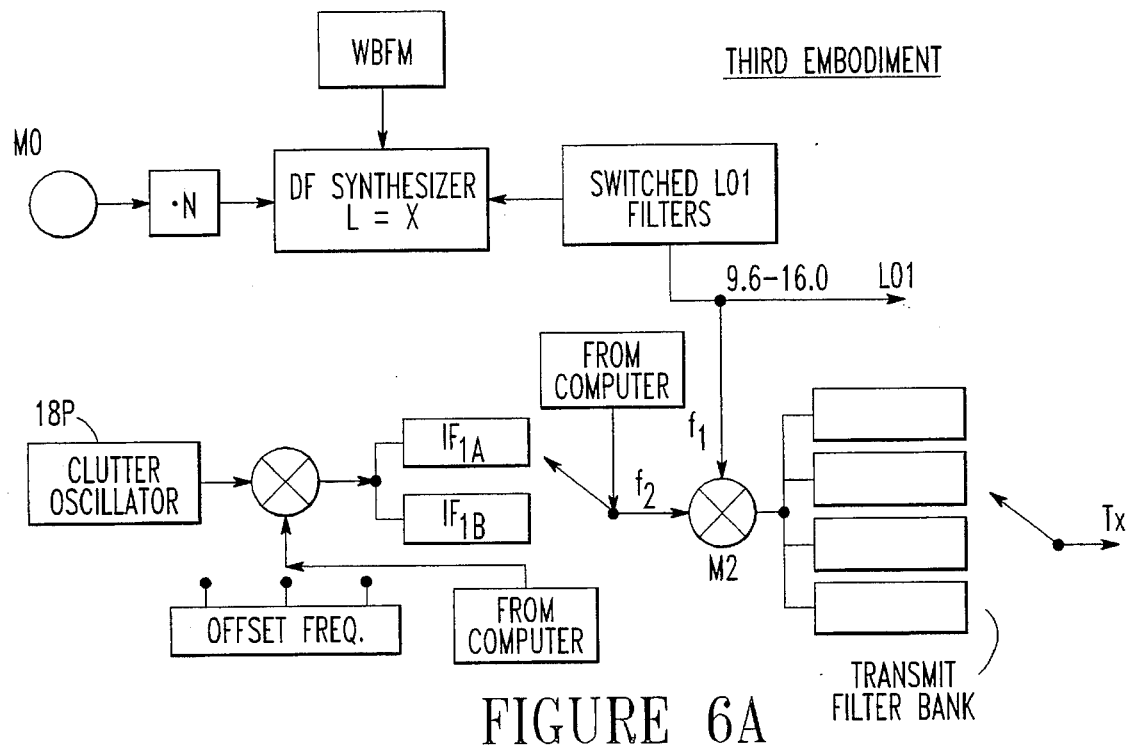
FIGS. 6A and 6B are schematic diagrams for a third embodiment of the invention in which a pulse doppler radar system employs a dual IF receiver and transmitter having a clutter function, with birds in both the receiver and the transmitter being sidestepped with no auxiliary synthesizer required.

FIG. 6A shows a first form of the third embodiment of the invention. In this embodiment, a receiver employs two (or more) first $IF_1$ frequencies. In this manner, birds which originate in both the transmitter and the receiver can be effectively sidestepped to provide quality wide-band operation. Receiver LO1 is generated directly by the DF synthesizer. The transmit frequency is formed by summing the receiver LO1 with a clutter frequency $f_2$, and the clutter frequency is selectable, such as under computer control like that described in FIG. 2A. However, there is no auxiliary synthesizer. Instead, the receiver $IF_1$ is changed to a selectable one of other multiple values over various portions of the total band to sidestep birds in mixer M1 and transmitter mixer M2. In this case, receiver $IF_1$ in the receiver is switched to equal one of the two clutter offset frequencies: $IF_{1A}$ or $IF_{1B}$. As already indicated, this concept can be extended to more than two receiver $IF_1$s.

Figure 6B:
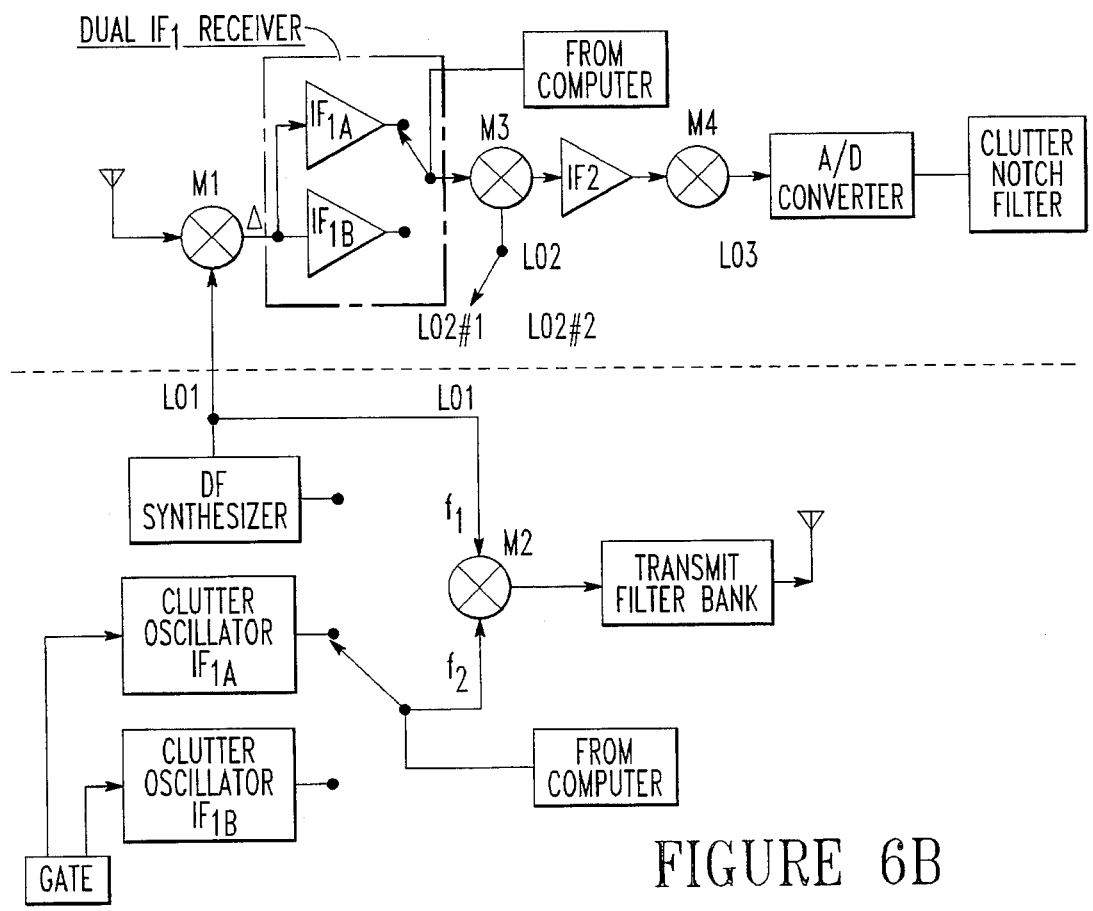

FIG. 6B shows another form of the third embodiment, i.e., another dual $IF_1$ system which illustrates other advantages of the dual $IF_1$ approach for receiver mechanization. Harmonics of LO2 can leak over the $IF_1$ stage and appear as a false signal at the antenna input. A dual $IF_1$ receiver requires a selection of two LO2s, and such bird problems can be avoided over a large bandwidth.

Further, some receiver mechanizations require a clutter track function to be provided on receiver LO2. As such, it is important that harmonics of LO2 be prevented from appearing in band at the first mixer input. A dual $IF_1$ receiver, with corresponding selectable LO2s, avoids this problem.

If it is required to clutter track on the receiver LO1, and the desirable features of the dual $IF_1$ receiver are desired, a modified mechanization such as shown in FIG. 15 is required. In this case, the $IF_1$ frequencies should not be generated directly, so an auxiliary synthesizer is required to combine with the clutter track function to generate LO1.

Figure 7:
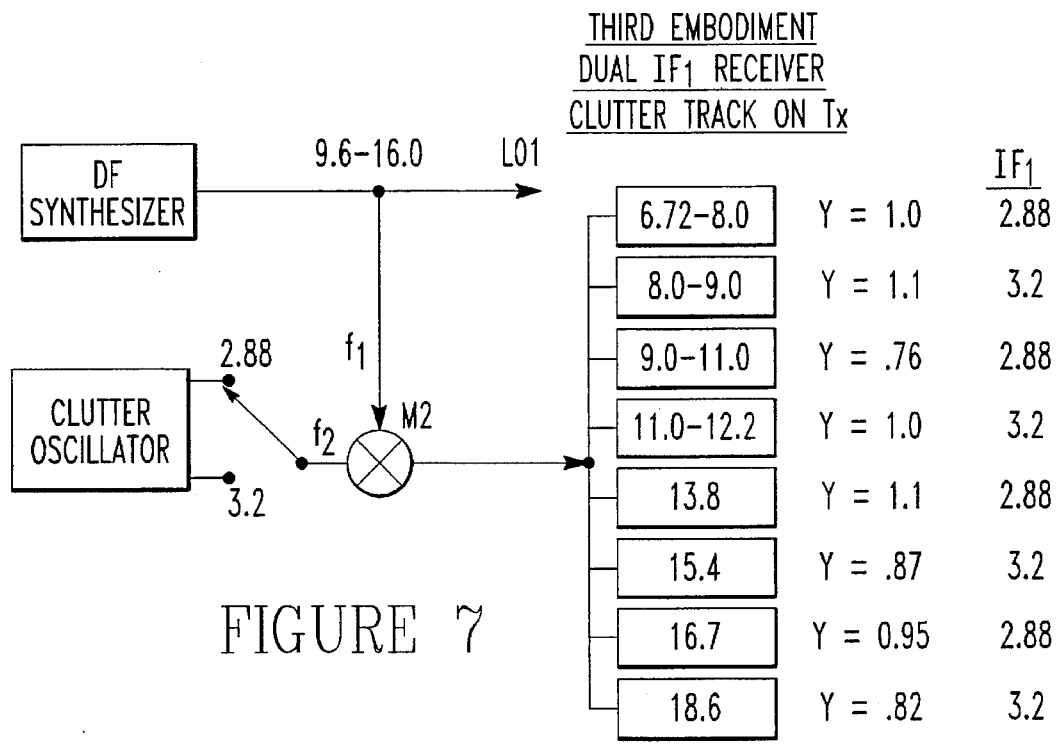
FIG. 7 shows an example of the third embodiment of FIGS. 6A and 6B with specific values indicated for system filters.

Some of the unique spurious avoidance features of the invention are illustrated in the drawings. An example of the invention is shown in FIG. 7 which covers a band from 6720 to 18600 MHz in eight transmit bands. The receiver $IF_1$ and clutter offset frequencies toggle between 2880 MHz and 3200 MHz in such a way that both the LO1 and Tx bands are free of clutter frequency harmonics.

Figure 8A:
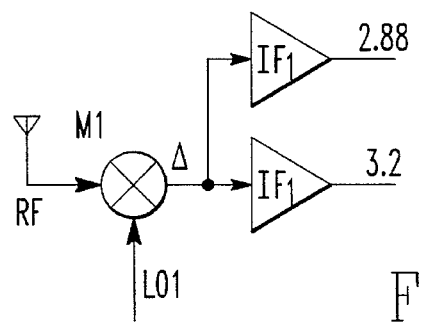
FIGS. 8A–8C illustrate the manner in which birds are excluded from receiver processing in wideband pulse doppler radar systems in accordance with the invention.
Figure 8B:
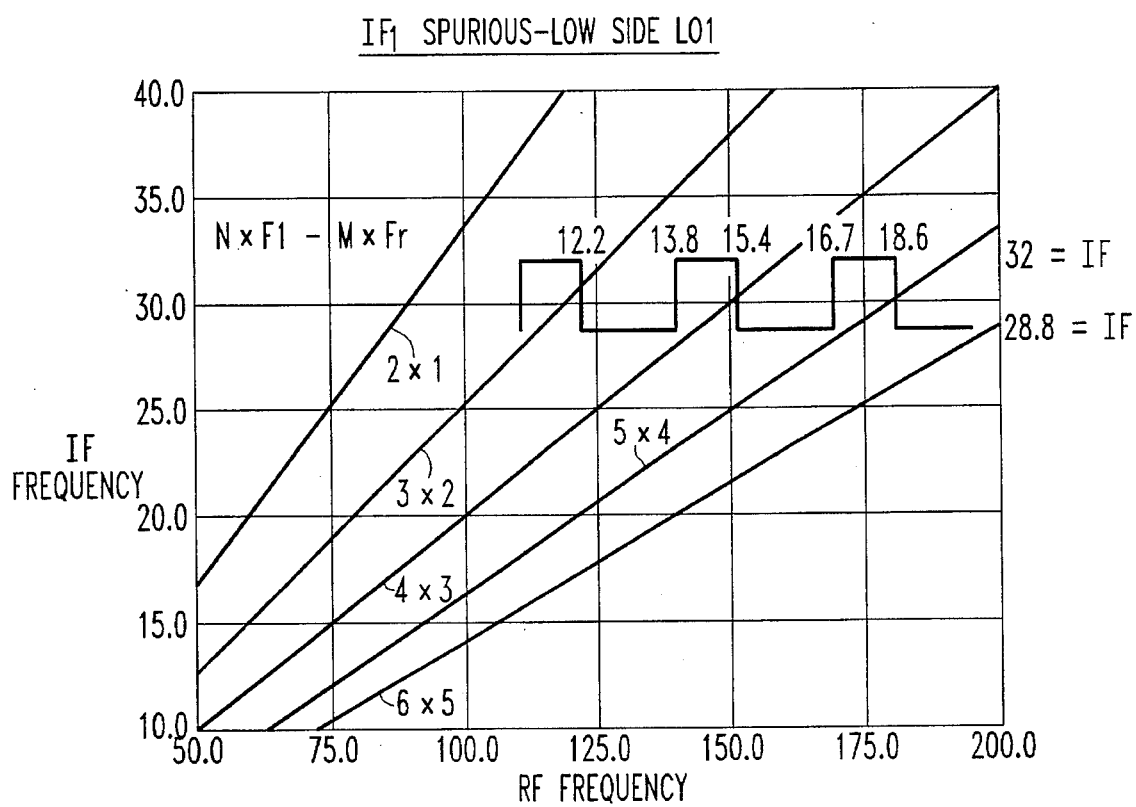

FIG. 8B shows a plot of receiver first mixer spurious versus RF frequency and $IF_1$ frequency for the case of LO1 below the antenna input (FIG. 8A). This corresponds to operation from 12.2 GHz to 18.6 GHz for FIG. 6, with $IF_1$ toggling between 2.88 GHz and 3.20 GHz. In such process, not only are the receiver first mixer spurious avoided by switching $IF_1$, but also the spurious of mixer M2 of FIG. 7 are avoided.

Figure 8C:
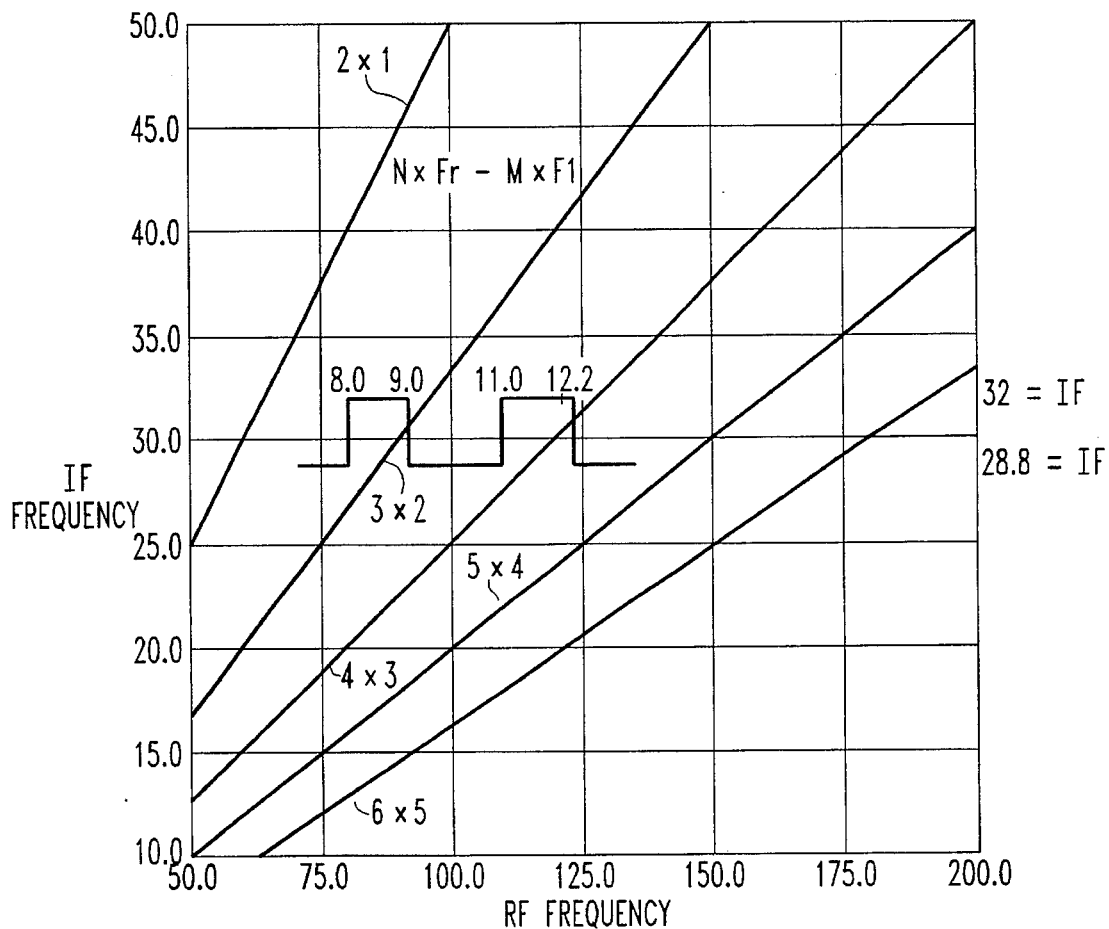
Figure 9:
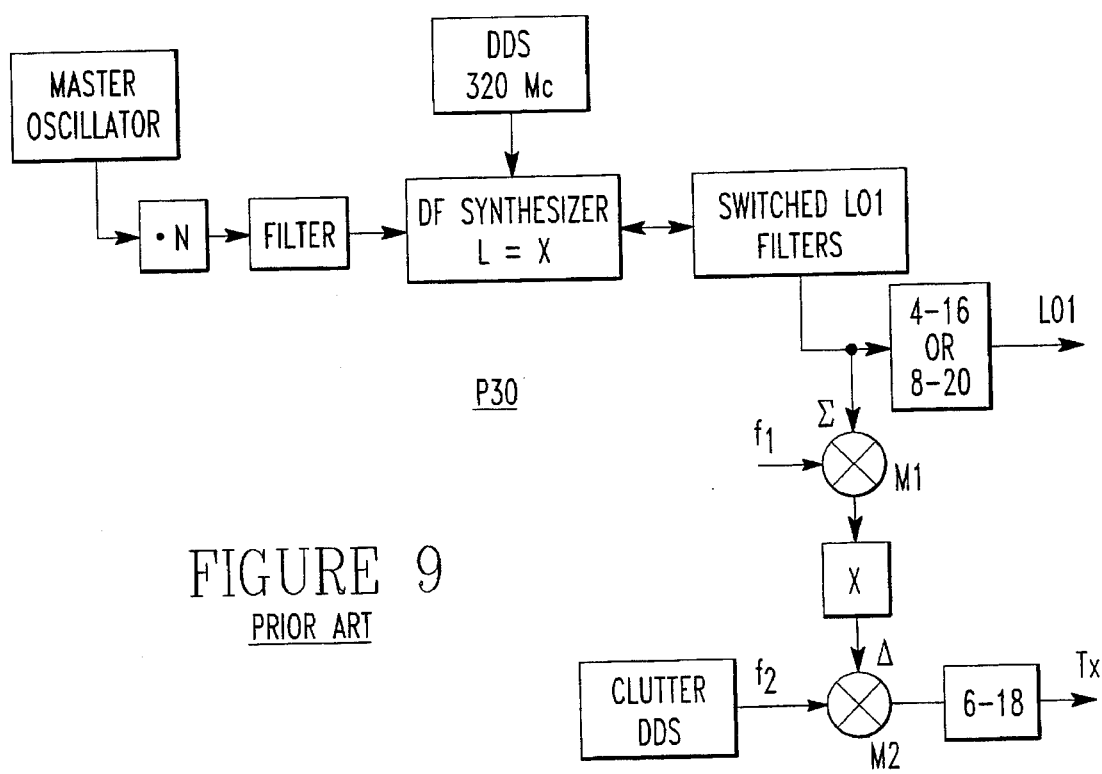
FIGS. 9–12 are schematic diagrams for respective limited bandwidth pulse doppler radar systems of the prior art.

FIG. 8C shows a plot of receiver first mixer spurious versus RF frequency and $IF_1$ frequency for the case of LO1 above the antenna input. This corresponds to operation from 6.72 GHz to 12.2 GHz for FIG. 6A. Not only are the receiver first mixer birds avoided by switching $IF_1$, but also the birds of mixer M2 of FIG. 6A are avoided.

Reference is made to subsequent description of the dual $IF_1$ concept for an explanation of why both transmit mixer M2 and receiver mixer M1 have good and bad regions which occur simultaneously.

From an electronic counter-measures point of view, it is desirable to provide a radar receiver with a high $IF_1$, if the bad regions in the receiver first mixer can be avoided. From a STALO point of view, with respect to FIGS. 6A, 6B, and 7, it is desirable to provide high clutter selectable frequencies for $f_2$ so that the number of transmit output filters can be minimized. With high values for $f_2$, only two clutter offset frequencies are required to provide low spurious STALO performance over a very large bandwidth.

High dynamic range receiver/STALO operation over a very large bandwidth is conventionally difficult to achieve because of the radar clutter tracking function. However, in the present invention, selectable clutter offset frequencies enable dead zones in the STALO to be avoided.

The described embodiment of FIG. 2A provides a solution to a major part of the total problem; it avoids birds which originate in the transmitter, but not those that originate in the receiver. The normal transmit frequencies are generated by summing the receiver LO1 with an offset frequency in the mixer 44. When bad spurious regions are encountered in the mixer 44 when operating over a large frequency band, such bad regions are sidestepped by summing in the mixer 44 a frequency signal from the auxiliary synthesizer 40 with an offset frequency $F_x$ to generate portions of the transmit band. More than one set of auxiliary synthesizer and offset frequencies may be required to operate over a very wide band of frequencies. This approach is preferably used when a receiver with two first $IF_1$ frequencies cannot or will not be employed in the system receiver.

In applying the invention in the described embodiments of the invention, the following problems are addressed and resolved:

1) Spurious of clutter track function fall on transmit frequencies and cause false targets—"Fo leakage"; or fall on receiver LO1 if clutter tracking is done on LO1.

2) Spurious generated in receiver first mixer can appear as false targets; such spurious are caused by large returns from ground clutter of targets.

3) Harmonics of receiver LO2 can appear in band at front end of receiver and look like false targets, and are especially bad if clutter track is done on LO2.

In resolving these problems, a receiver and STALO are structured to operate together to achieve spurious free performance with clutter tracking function on transmit or receiver LOs. A similar technique can also be applied to communication systems.

EXPLANATION OF DUAL $IF_1$ CONCEPT

Figure 13:
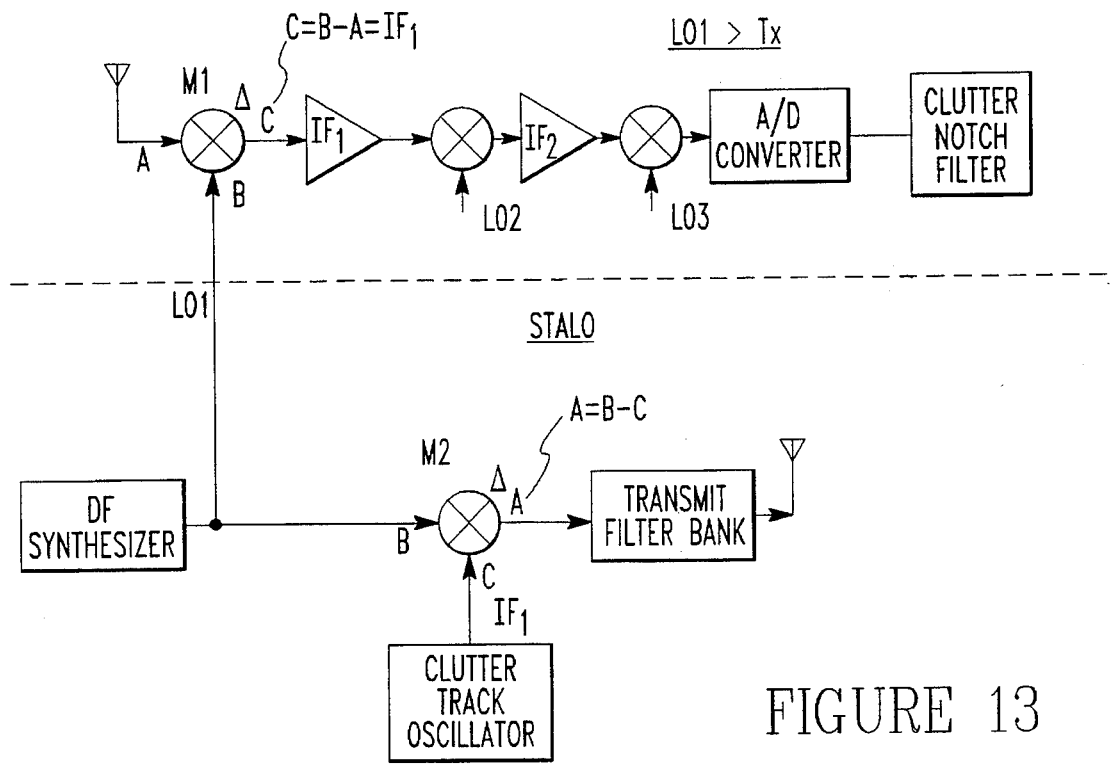
FIGS. 13 and 14 are schematic diagrams that further illustrate the manner in which the invention operates to exclude birds from the wide operating frequency band of the respective embodiments of FIGS. 2A and 2B.

FIG. 13 shows a radar receiver-transmitter mechanization with clutter tracking function on transmit and LO1>Tx. Synthesizer frequency B is equal to receiver LO1 frequency, receiver $IF_1$ frequency is C, transmit frequency is A, and A=B−C and C=B−A. Comparison of frequency ratio A/B at receiver mixer M1, and frequency ratio C/B at transmitter mixer M2 with the Appendix bird charts shows that bad regions in M1 correspond to bad regions in M2, and clean regions in M1 correspond to clean regions in M2 on the charge for output=B−A applied to both mixers.

In FIG. 13, the following table applies:

| M1 | M1 Birds | M2 | M2 Birds |
|---|---|---|---|
| A/B = 0.75 | 3A−2B | C/B = .25 | 3C, 2B−5C |
| A/B = 0.80 | 4A−3B | C/B = .20 | 4C, 2B−6C |
| A/B = 0.833 | 5A−4B | C/B = .167 | 5C, 2B−7C |

Figure 14:
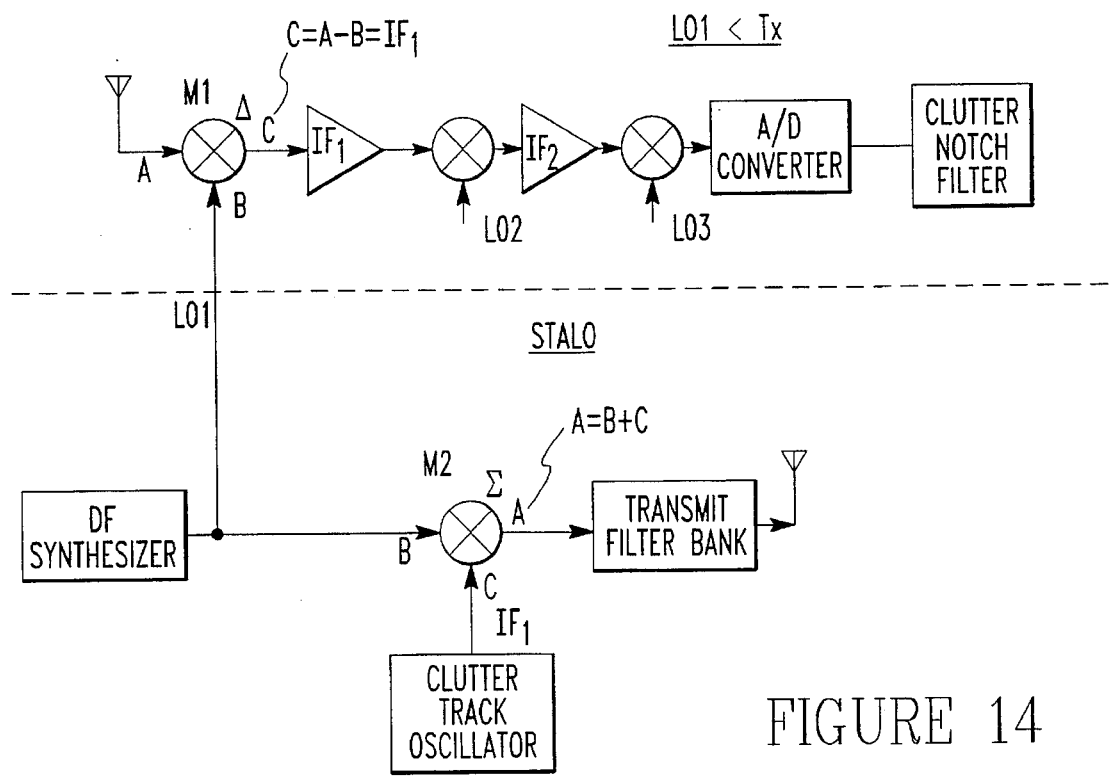

FIG. 14 shows a radar receiver-transmitter similar to that shown in FIG. 13, but in this case LO1<Tx, receiver $IF_1$=C=A−B, and transmit frequency A=B+C. Examination of frequency ratio B/A in receiver mixer M1 and frequency ratio C/B in transmitter mixer M2 in both bird charts in Appendix I again indicates that bad regions in M1 correspond to bad regions in M2, and clean regions in M1 correspond to clean regions in M2.

In FIG. 14, the following table applies:

| M1 B/A | M1 Birds | M2 C/B | M2 Birds |
|---|---|---|---|
| B/A = 0.75 | 3B–2A | C/B = .333 | 2B–2C, 4C |
| B/A = .80 | 4B–3A | C/B – .25 | 2B–3C, 5C |
| B/A = 0.833 | 5B–4A | C/B – .200 | 2B–4C, 6C |

APPENDIX I

Two bird (spurious) charts (shown below) are useful in establishing logic for switching the various switches in embodiments of the invention. One bird chart is for the case where $F_{output}$=A+B and the other bird chart is for the case where $F_{output}$=A–B. These charts were published in Electronics, August 1946, R. S. Badesa, NRL.

The left hand column in each chart is the ratio A/B, where A and B are input frequencies to a mixer. The ratio A/B is shown from A/B=0 to A/B=1 in convenient increments. The top row in each chart is the order of mixing product at the mixer output, from 1 to 16.

Each chart shows in the order columns possible combinations of harmonics of A and harmonics of B which may be produced in the mixer and appear near the desired output of (A+B) or (A–B).

For example, suppose that the mixer output is A+B and that the ratio A/B=0.5. Thus, A=0.5B and the mixer output= 1.5B. From Chart 2, birds of the order 3 included in the mixer output are 2B–A and 3A.

Appendix I - Chart 1

ORDER

| R = A/B | 1<br>B | 2<br>B+A | 3<br>B±2A | 4<br>B±3A | 5<br>B±4A | 6<br>B±5A | 7<br>B±6A | 8<br>B±7A | 9<br>B±8A | 10<br>B±9A | 11<br>B±10A | 12<br>B±11A | 13<br>B±12A | 14<br>B±13A | 15<br>B±14A |
|---|---|---|---|---|---|---|---|---|---|---|---|---|---|---|---|
| 0.000 | B | | | | | | | | | | | | | | |
| 0.063 | | | | | | | | | | | | | | | 15A |
| 0.067 | | | | | | | | | | | | | | 14A | |
| 0.072 | | | | | | | | | | | | | 13A | | |
| 0.077 | | | | | | | | | | | | 12A | | | 2B-13A? |
| 0.083 | | | | | | | | | | | 11A | | | | |
| 0.091 | | | | | | | | | | 10A | | | | 2B-12A | |
| 0.100 | | | | | | | | | 9A | | | | | | |
| 0.111 | | | | | | | | 8A | | | | | 2B-11A | | 14A-B? |
| 0.125 | | | | | | | 7A | | | | | 2B-10A | | | |
| 0.133 | | | | | | | | | | | | | | 13A-B | |
| 0.143 | | | | | | 6A | | | | | 2B-9A | | | | |
| 0.154 | | | | | | | | | | | | | 12A-B | | 3B-12A? |
| 0.167 | | | | | 5A | | | | | 2B-8A | | | | | |
| 0.182 | | | | | | | | | 2B-7A | | | 11A-B | | 3B-11A | |
| 0.200 | | | | 4A | | | | 2B-6A | | | 10A-B | | | | |
| 0.210 | | | | | | | | | | | | | 3B-10A | | |
| 0.222 | | | | | | | | 7A-2B | | | | | | | |
| 0.231 | | | | | | | | | | | | | | | |
| 0.250 | | | 3A | | | 2B-5A | | | | 3B-7A<br>8A-2B | 9A-2B | | | | |
| 0.273 | | | | | | 5A-B | | | 7A-2B<br>3B-6A | | | 3B-8A<br>9A-2B | | | | 4?<br>12? |
| 0.286 | | | | | | | | | | | | | 4B-9A<br>11A-3B | | |
| 0.300 | | | | | | | | | | | 10A-3B | | | | |
| 0.308 | | | | | | | | | | | | 9A-3B | | | |
| 0.333 | | 2A | | | | | 2B-5A | | | | | | | | |
| 0.364 | | 2A | | | | | | | | | | | 4B-9A | | 11A-4B? |
| 0.375 | | | | | 4A-B | | | | | | | 4B-8A | | | |
| 0.400 | | | | | | | | 6A-2B | | | 8A-3B | | | | 5B-10A? |
| 0.416 | | | | | | | | | | | | | | | |
| 0.423 | | | | | | | | | | | | | | | |
| 0.445 | | | | | | | | | | | | | | | |
| 0.455 | | | | | | 4A-2B | | | | | 4B-7A | | | 10A-4B<br>5B-9A | 10A-5B? |
| 0.500 | A | | 3A-B | | 2B-3A | | 5A-2B | 3B-5A | | 7A-3B | | | 9A-4B | | |
| 0.545 | | | | | | | | | 6A-3B | | | 8A-4B | | | |
| 0.555 | | | | | | | | | | | | | 5B-8A | 9A-5B | 6B-9A? |
| 0.571 | | | | | | | | | | | | | | | |
| 0.600 | | | | | | | | | | 4B-6A | 7A-4B | | | | |
| 0.625 | | | | | | | 3B-4A | | | | | 5B-7A | 8A-5B | | |
| 0.667 | | | 2A-B | | 3A-2B | | | | 4B-5A | 6A-4B | | 7A-5B | | | |
| 0.700 | | | | | | | | | | | | | | | |
| 0.715 | | | | | | | | | | | | | | | 9A? |
| 0.750 | | | | | | | | 5A-3B | | | 5B-6A | | | 6B-8A | |
| 0.775 | | | | | | | | | | | | | | | |
| 0.800 | | | | | | 4A-3B | | | 4B-5A | | | | | 8A-6B | |

-continued

Appendix I - Chart 1

| R = A/B | 1<br>B | 2<br>B+A | 3<br>B±2A | 4<br>B±3A | 5<br>B±4A | 6<br>B±5A | 7<br>B±6A | 8<br>B±7A | 9<br>B±8A | 10<br>B±9A | 11<br>B±10A | 12<br>B±11A | 13<br>B±12A | 14<br>B±13A | 15<br>B±14A |
|---|---|---|---|---|---|---|---|---|---|---|---|---|---|---|---|
| | | | | | | | | | | | | | | | ORDER |
| 0.000 | | | | | | | | | | | | | | | |
| 0.833 | | | | | | | | | 5A–4B | | 6A–5B | | 6B–7A | | 7B? |
| 0.853 | | | | | | | | | | | | | 6A–6B | | |
| 0.875 | | | | | | | | 4B–4A | | 5B–5A | | 6B–6A | | 7B–7A | |
| 1.000 | | | | 2B–2A | | 3B–3A | | | | | | | | | |

Appendix I - Chart 2

| R = A/B | 1<br>B | 2<br>B−A | 3<br>B±2A | 4<br>B±3A | 5<br>B±4A | 6<br>B±5A | 7<br>B±6A | 8<br>B±7A | 9<br>B±8A | 10<br>B±9A | 11<br>B±10A | 12<br>B±11A | 13<br>B±12A | 14<br>B±13A | 15<br>B±14A |
|---|---|---|---|---|---|---|---|---|---|---|---|---|---|---|---|
| 0.000 | B | | | | | | | | | | | | | | |
| 0.072 | | | | | | | | | | | | | | | 2B−13A<br>15A |
| 0.077 | | | | | | | | | | | | | | 2B−12A<br>14A | |
| 0.083 | | | | | | | | | | | | | 2B−11A<br>13A | | |
| 0.091 | | | | | | | | | | | | 2B−10A<br>12A | | | |
| 0.100 | | | | | | | | | | | 2B−9A<br>11A | | | | |
| 0.111 | | | | | | | | | | 2B−8A<br>10A | | | | | |
| 0.125 | | | | | | | | | 2B−7A<br>9A | | | | | | |
| 0.143 | | | | | | | | 2B−6A<br>8A | | | | | | | |
| 0.154 | | | | | | | 2B−5A<br>7A | | | | | | | | 3B−12A<br>14A−B |
| 0.167 | | | | | | 2B−4A<br>6A | | | | | | | | 3B−11A<br>13A−B | |
| 0.182 | | | | | | | | | | | | | 3B−10A<br>12A−B | | |
| 0.200 | | | | | 2B−3A<br>5A | | | | | | | 3B−9A<br>11A−B | | | |
| 0.222 | | | | | | | | | | | 3B−8A<br>10A−B | | | | 4B−11A<br>13A−2B |
| 0.250 | | | | 2B−2A<br>4A | | | | | | 3B−7A<br>9A−B | | | | 4B−10A<br>12A−2B | |
| 0.273 | | | | | | | | | | | | | 4B−9A<br>11A−2B | | |
| 0.286 | | | | | | | | | 3B−6A<br>8A−B | | | 4B−8A<br>10A−2B | | | |
| 0.300 | | | | | | | | | | | 4B−7A<br>3A−2B | | | | |
| 0.335 | | | | | | | | 3B−5A<br>7A−B | | | | | | | 5B−10A<br>12A−3B |
| 0.364 | | | | | | | | | | | | | | 5B−9A<br>11A−3B | |
| 0.375 | | | | | | | 3B−4A<br>6A−B | | | 4B−6A<br>8A−2B | | | | | |
| 0.400 | | | | | | | | | | | | | | | |
| 0.425 | | | | | | | | | | | | | | | |

Appendix I - Chart 2

| R=A/B | 1 B | 2 B−A | 3 B±2A | 4 B±3A | 5 B±4A | 6 B±5A | 7 B±6A | 8 B±7A | 9 B±8A | 10 B±9A | 11 B±10A | 12 B±11A | 13 B±12A | 14 B±13A | 15 B±14A |
|---|---|---|---|---|---|---|---|---|---|---|---|---|---|---|---|
| 0.000 | B | | | | | | | | | | | | | | |
| 0.445 | | | | | | | | | | | | | | | |
| 0.500 | | | 2B−A / 3A | | | 3B−3A / 5A−B | | | 4B−5A / 7A−2B | | | 5B−7A / 9A−3B | | | 6B−9A / 11A−4B |
| 0.555 | | | | | | | | | | | | | | 6B−8A / 10A−4B | |
| 0.571 | | | | | | | | | | | | | 5B−8A / 10A−3B | | |
| 0.600 | | | | | | | | | | | 5B−6A / 8A−3B | | | | |
| 0.625 | | | | | | | | 4B−4A / 6A−2B | | | | | | | |
| 0.667 | | | | | 3B−2A / 4A−B | | | | | 5B−5A / 7A−3B | | | 3B−7A / 9A−4B | | 7B−8A / 10A−5B |
| 0.715 | | | | | | | | | | | | 6B−6A / 8A−4B | | | |
| 0.750 | | | | | | | 4B−3A / 5A−2B | | | | | | | | |
| 0.800 | | | | | | | | | 5B−4A / 6A−3B | | | | | 7B−7A / 9A−5B | |
| 0.833 | | | | | | | | | | | 6B−5A / 7A−4B | | | | |
| 0.850 | | | | | | | | | | | | | 7B−6A / 8A−5B | | |
| 0.875 | | | | | | | | | | | | | | | 8B−7A / 9A−? |
| 1.000 | | 2B / 2A | | 3B−A / 3A−B | | 4B−2A / 4A−2B | | 5B−3A / 5A−3B | | 6B−4A / 6A−4B | | 7B−5A / 7A−5B | | 8B−6A / 8A−6B | |

Figure 1D:
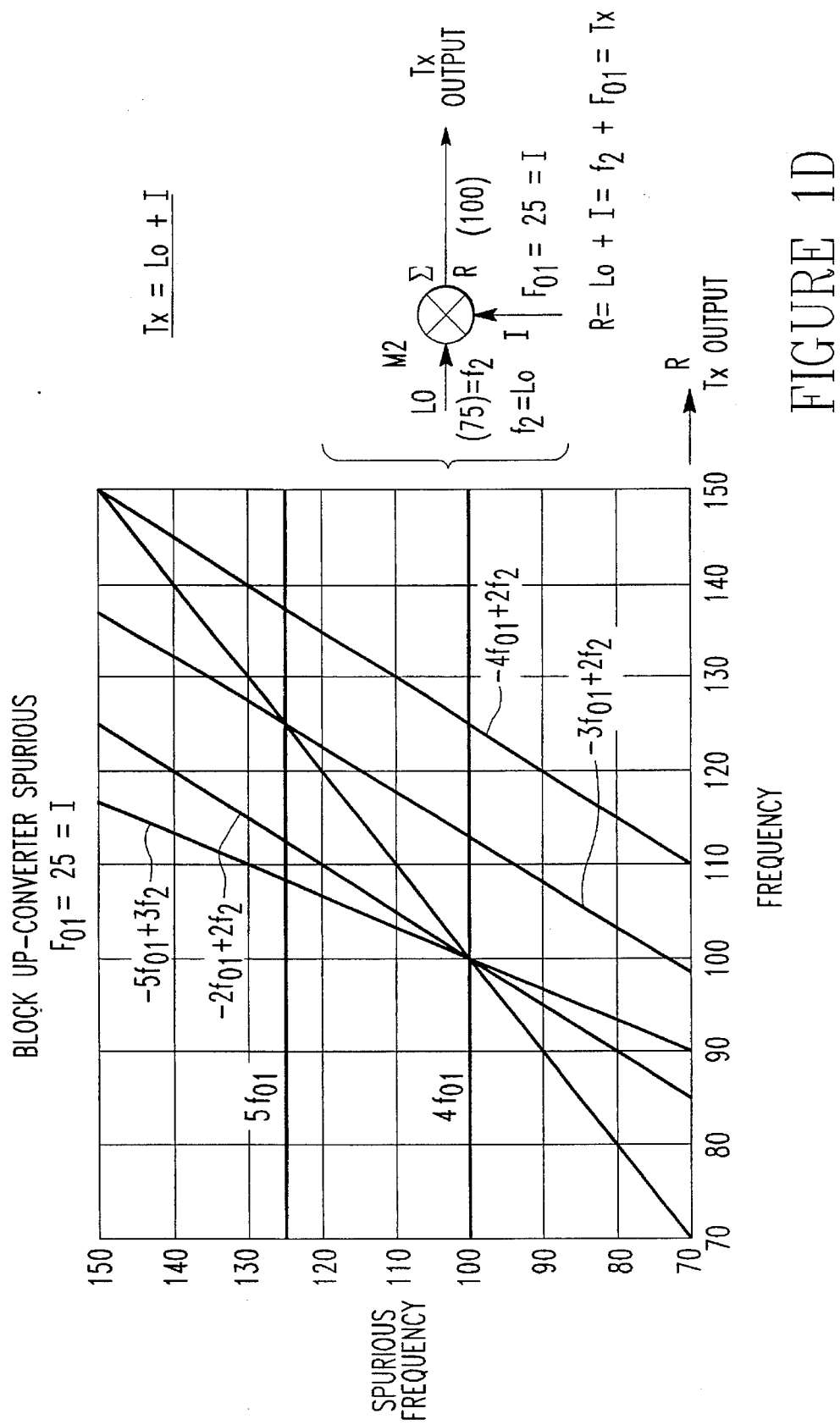
FIGS. 1D and 1E are computer plots of transmitter generated bird signals.

FIG. 1D is a predictive computer generated plot of birds generated in the mixer M2 of FIG. 1C when the transmit output frequency is equal to the sum of the frequencies at the LO and I ports.

If LO=75 and I=$fo_1$=25, the output frequency is 100. The plot shows that 4I, 2L-2I, and 3L-5I spurs appear at the mixer output on top of the output frequency of 100.

If the mixer bird Chart 2 is examined, A/B=25/75=0.33, and 2B-2A, 4A, 3B-5A, 7A-B, etc., should appear at the mixer output. Accordingly, the bird Chart 2 does agree with the computer prediction of FIG. 1D.

Figure 1E:
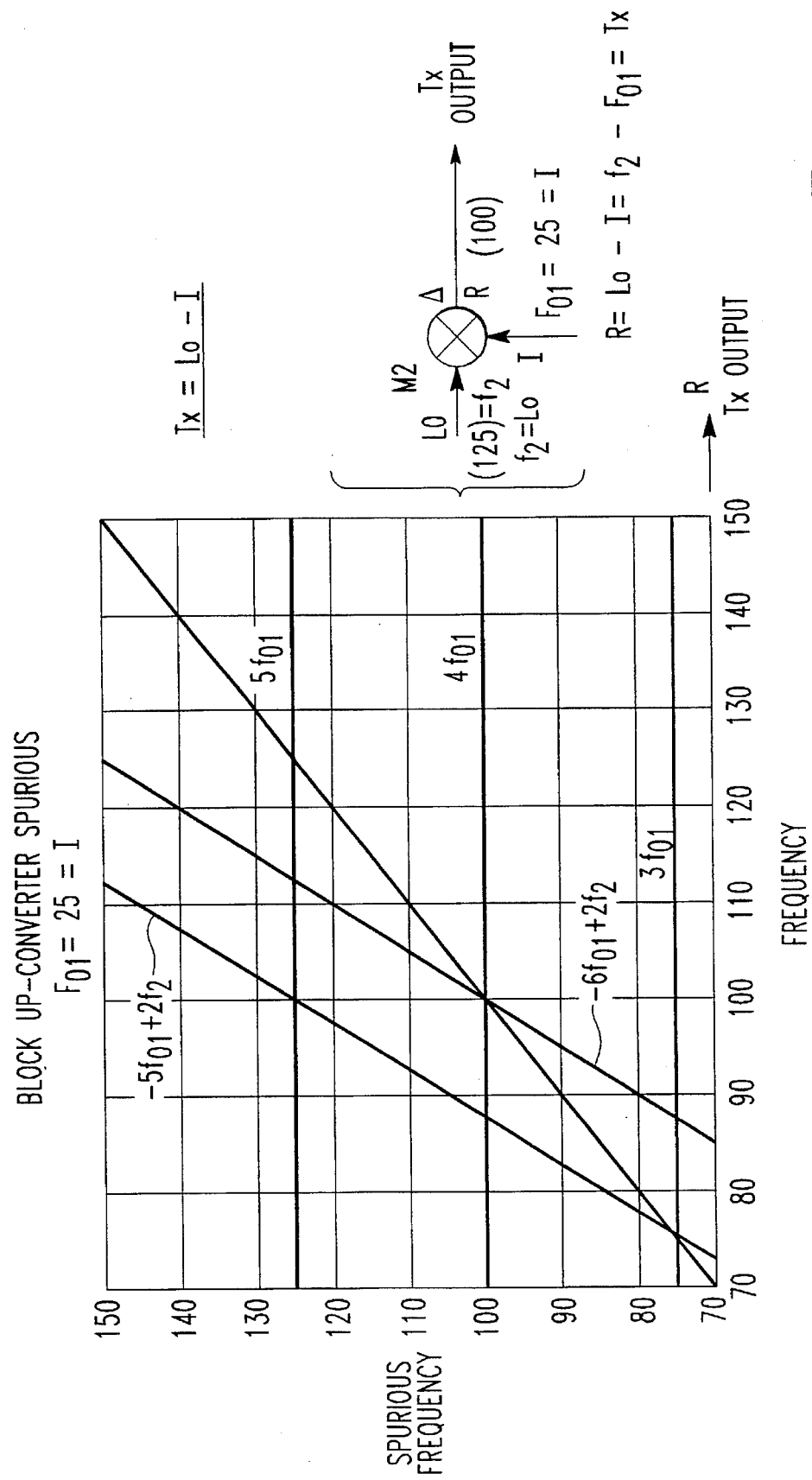

FIG. 1E is a predictive computer generated plot of the birds generated in the mixer M2 when the transmit output frequency is equal to the difference of the frequencies of the LO and I ports.

If LO=125 and I=25, the output frequency is 100. The plot shows that 4I and 2L-6I appear at the mixer output on top of the output frequency of 100.

In the mixer bird Chart 1, A/B=0.20, and 4A and 2B-6A, etc., appear at the output. Accordingly, the bird Chart 1 agrees with the computer prediction of FIG. 1E.

APPENDIX II—PRIOR ART

Various configurations have been considered to obtain wider band receivers with various advantages and disadvantages. The main disadvantage with all of the known prior art approaches is that there are dead regions where harmonics of the clutter frequency fall in the transmit or receiver LO1 band. Thus, the clutter center frequency cannot be stepped in increments so that it does not interfere with the Transmit/LO1 band of interest.

The main problem has been that harmonics of the clutter frequency or of any up/down IF frequency, no matter what it is, fall in both LO1 and Tx bands at numerous places.

The LO1 band is not as broad as the Tx band since both LO1>Tx and LO1<Tx modes can be employed in the receiver.

Clutter tracking in receiver LO2 is not an optimal solution because harmonics of LO2 can fall in both Tx and LO1 bands at the front end of receiver.

Disadvantages of a system P30 providing up/down at X/Ku (FIG. 9):

a) 1/f noise of GaAs amplifiers at Ku band.

b) Several sets of switched filters are required: X and Tx.

c) Several sets of fixed selectable and clutter selectable frequencies are required: $f_1$ and $f_2$.

d) The number of bird problems is doubled with two mixers.

Figure 10:
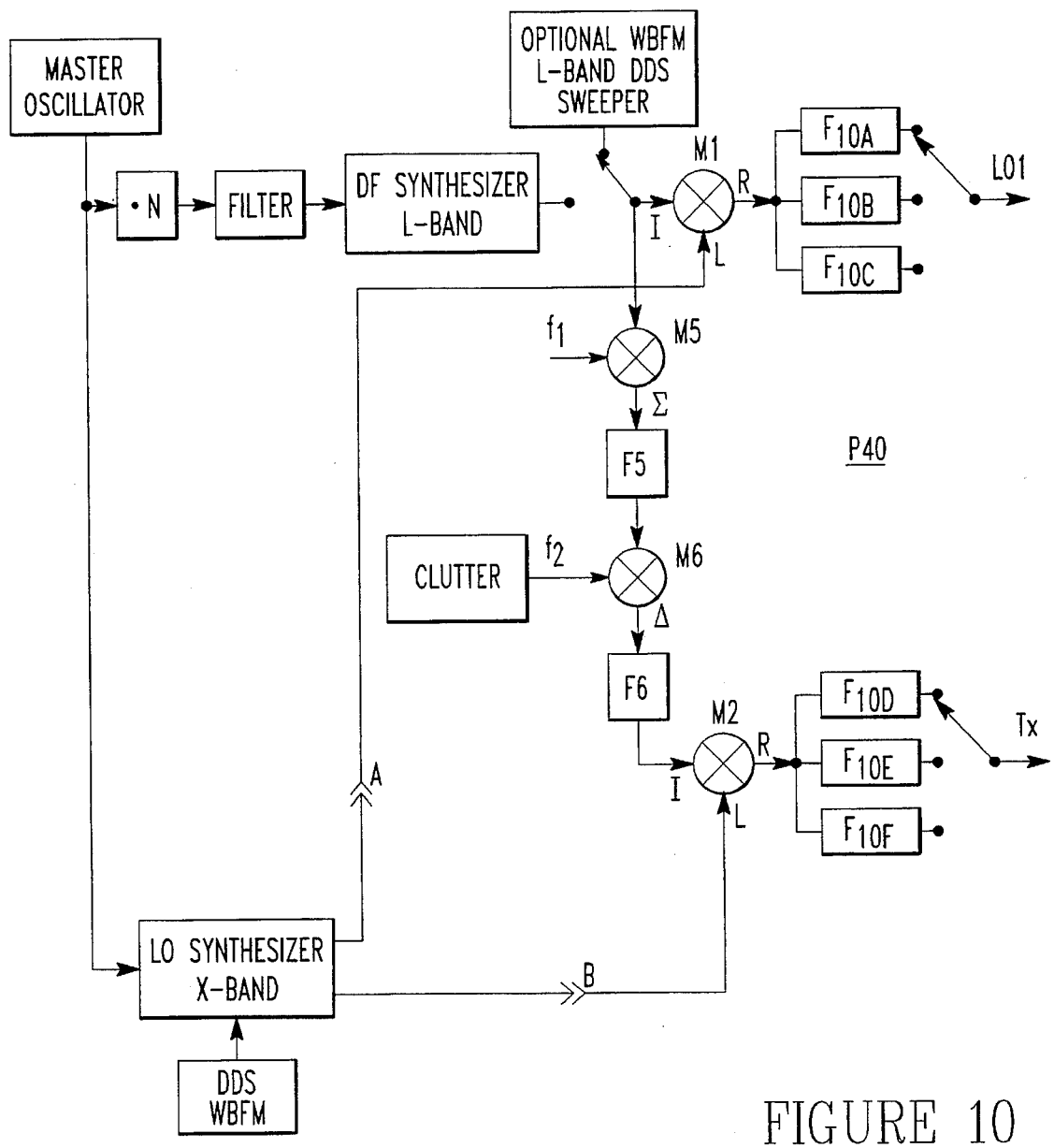
Figure 11:
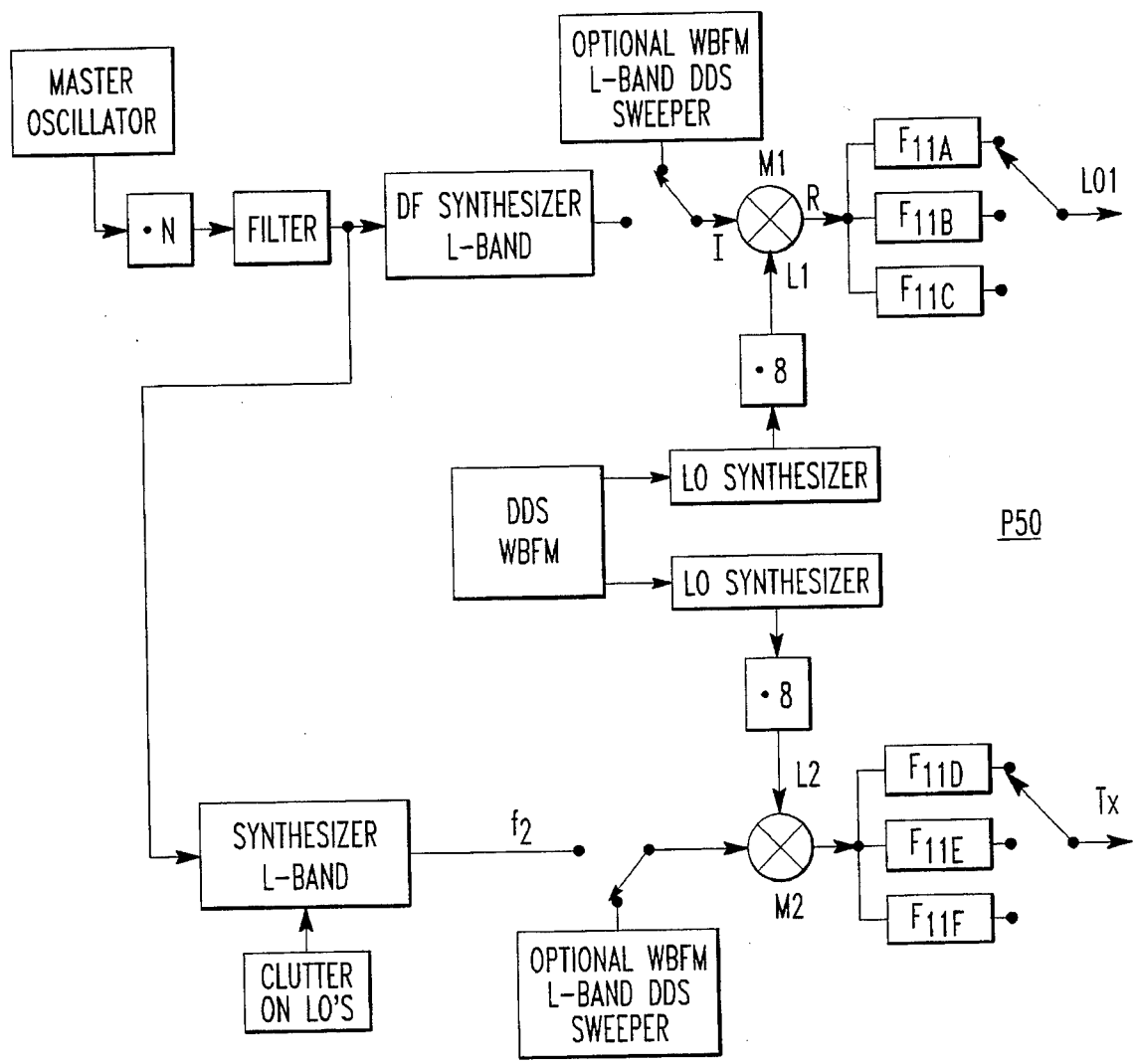
Figure 12:
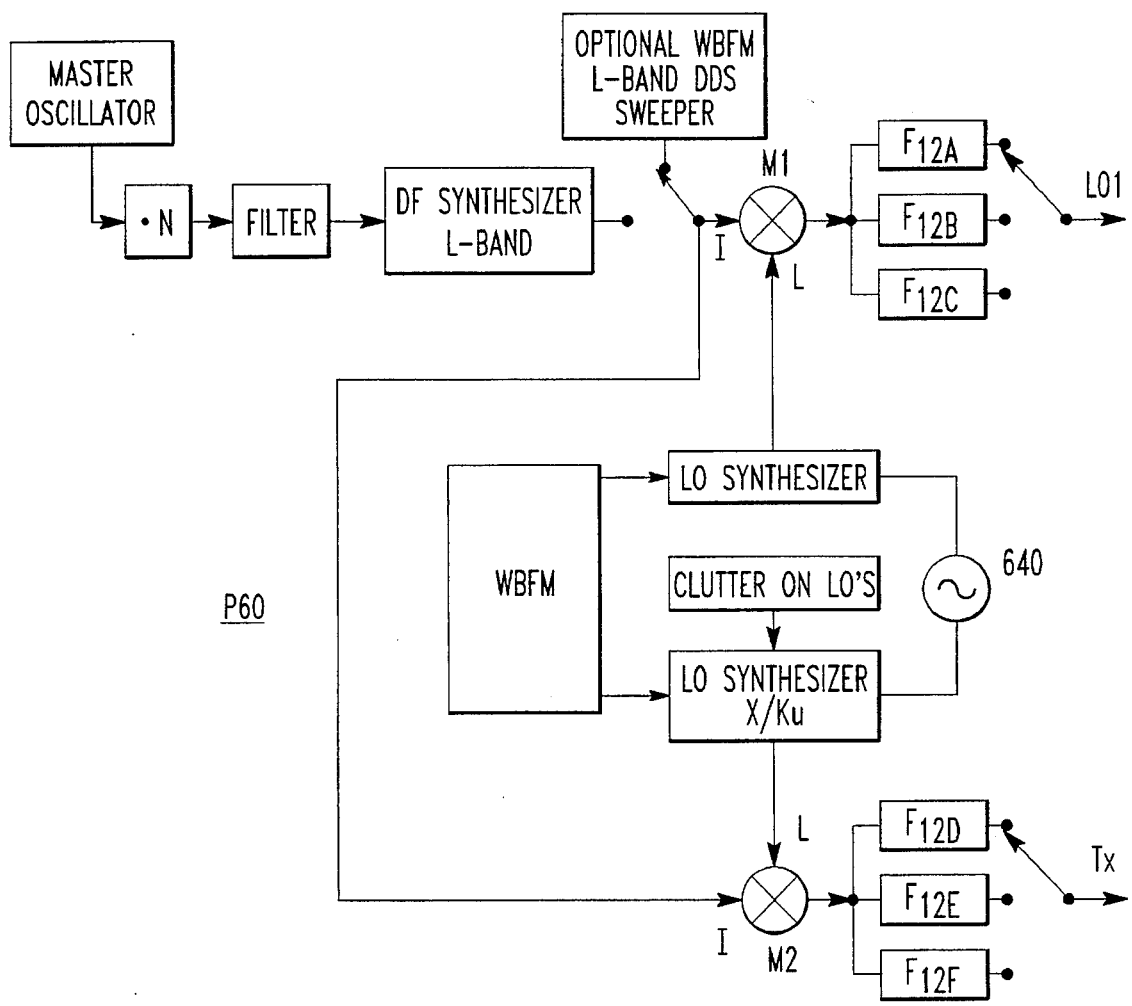

Disadvantages of a system P40 providing up/down at L (FIG. 10:)

a) Birds in M2-Tx-degenerate because the input band of frequencies to M5 must be different—lower—from output band of frequencies at F6 to be filterable.

b) Clutter frequency $f_2$ will still be harmonically related to LO1 and Tx if it is not selectable.

c) Switched output filters are still needed for M2.

d) Selectable frequencies are still needed for L port of M2.

Disadvantages of system P50 having two synthesizers (FIG. 11):

a) Too much hardware needed.

b) When clutter track is put on 5 LO frequencies, resulting harmonics fall in LO1 and Tx bands. These LO frequencies must be chosen other than with respect to receiver LO1 and transmit bands. The problem is thus not resolved.

Disadvantages of a system P40 providing single L/Double X (FIG. 12):

a) Here, the clutter function is put on the Tx X/Ku band LO frequencies of M2. The unused LO frequencies can be gated off, but the used LO can still fall harmonically in-band with respect to LO1 and Tx. The problem has thus not been solved.

b) Too much hardware needed.

The foregoing description of the preferred embodiments has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

What is claimed is:

1. A large bandwidth communication system comprising:

a transmitter system for generating transmit signals over a selectable frequency operating range;

a receiver system having a first mixer for mixing an LO1 signal with received transmit signals;

the receiver system having a first IF system for processing signals received from the first mixer;

a frequency synthesizer system for generating frequency signals for application to at least a transmit mixer in the transmitter and to at least the first mixer in the receiver; and a control system for selecting and applying a modified frequency value for at least one of plural frequencies including that of the LO1 signal applied to the first mixer, that of a frequency signal applied to the transmit mixer, and an IF frequency of the first IF system, with the modified frequency value selected as a function of the system operating frequency and stored spurious amplitude data to sidestep spurious signals in portions of the total system frequency operating bandwidth where spurious amplitudes are excessive and otherwise would interfere with quality reception.

2. The system of claim 1 wherein:

a dither signal generating system is coupled to one of the transmit mixer and the first receiver mixer.

3. The system of claim 1 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

4. The system of claim 2 wherein:

the communication system is a radar system, the receiver and transmitter systems are radar receiver and transmitter systems, and the dither signal generating system includes a clutter track oscillator generating a clutter track signal which is coupled to the transmit mixer to enable blockage of clutter from radar receiver processing.

5. The radar system of claim 4 wherein:

a transmit frequency selector switch couples one of an LO1 frequency signal and an auxiliary signal from the frequency synthesizer system to the transmit mixer; and the control system selectively controls the operation of the transmit frequency selector switch to sidestep spurious signals from receiver processing.

6. The radar system of claim 4 wherein the dither signal generating system further includes:

a clutter mixer to which an output of the clutter track oscillator is coupled;

an offset frequency generator subsystem having a plurality of offset frequency outputs coupled to the clutter mixed through a first selector switch;

a bank of clutter signal filters coupled to an output of the clutter mixer;

a second selector switch selectively coupling one of the clutter signal filter outputs to the transmit mixer;

a third selector switch selectively coupling an LO1 signal or an auxiliary frequency signal to the transmit mixer; and the control system selectively controls the operation of the first, second, and third selector switches to sidestep spurious signals from receiver processing.

7. The radar system of claim 6 wherein:

a bank of transmit filters is coupled to an output of the transmit mixer;

a fourth selector switch selectively couples one of the transmit filters to a transmitter system output; and the control system further selectively controls the fourth selector switch.

8. The radar system of claim 2 wherein:

the communication system is a radar system, the receiver and transmitter systems are radar receiver and transmitter systems, and the dither signal generating system includes a clutter track oscillator generating a clutter track signal which is coupled to the receiver first mixer to enable blockage of clutter from radar receiver processing.

9. The radar system of claim 8 wherein:

a clutter mixer to which an output of the clutter track oscillator is coupled;

an offset frequency generator subsystem having a plurality of offset frequency outputs coupled to the clutter mixer through a first selector switch;

a bank of clutter signal filters coupled to an output of the clutter mixer;

a second selector switch selectively coupling one of the clutter signal filter outputs to an LO1 mixer which has its output coupled to the receiver; and the control system selectively controls the operation of the first and second selector switches to sidestep spurious signals from receiver processing.

10. The radar system of claim 9 wherein:

a bank of transmit filters is coupled to an output of the LO1 mixer;

a third selector switch selectively couples one of the transmit filters to a receiver system input; and the control system further selectively controls the third selector switch.

11. The radar system of claim 5 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

12. The radar system of claim 6 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

13. The radar system of claim 8 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

14. The radar system of claim 9 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

15. The radar system of claim 1 wherein:

a transmit frequency selector switch couples one of an LO1 frequency signal and an auxiliary signal from the frequency synthesizer system to the transmit mixer; and the control system selectively controls the operation of the transmit frequency selector switch to sidestep spurious signals from receiver processing.

16. The system of claim 1 wherein:

the receiver system includes a plurality of IF1 units operating with different IF1 frequencies and coupled to an output of the receiver first mixer;

a first selector switch selectively couples outputs from the IF1 units to a second receiver mixer; and the control system selectively couples one of the IF1 units to the second receiver mixer through the first selector switch according to the system operating frequency and the stored spurious amplitude data to sidestep spurious signals in portions of the total system frequency operating bandwidth where spurious amplitudes are excessive and otherwise would interfere with quality reception.

17. The system of claim 16 wherein a dither signal generating system is coupled to the transmit mixer.

18. The system of claim 17 wherein:

the communication system is a radar system, the receiver and transmitter systems are radar receiver and transmitter systems, and the dither signal generating system includes a clutter track oscillator generating a clutter track signal which is coupled to the transmit mixer to enable blockage of clutter from radar receiver processing.

19. The radar system of claim 18 further including:

a plurality of clutter oscillators corresponding in number to the number of IF1 units and having respective operating frequencies equal to the IF1 frequencies of the respective IF1 units;

a second selector switch selectively coupling one of the clutter oscillators to the transmit mixer according to the IF1 unit selected for operation by the control system.

20. The radar system of claim 18 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

21. The radar system of claim 19 wherein:

the control system includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

22. The system of claim 16 wherein the plurality of IF1 units is two in number.

23. A large bandwidth communication system comprising:

means for transmitting transmit signals over a selectable frequency operating range;

means for receiving the transmit signals having a first mixer for mixing an LO1 signal with the transmit signals;

the receiving means having a first IF system for processing signals received from the first mixer;

means for generating frequency signals for application to at least a transmit mixer in the transmitting means and to at least the first mixer in the receiver;

means for controlling the transmitting and receiving means to select and apply a modified frequency value for at least one of plural frequencies including that of the LO1 signal applied to the first mixer, that of a frequency signal applied to the transmit mixer, and an IF frequency of the first IF system, with the modified frequency value selected as a function of the system operating frequency and stored spurious amplitude data to sidestep spurious signals in portions of the total system frequency operating bandwidth where spurious amplitudes are excessive and otherwise would interfere with quality reception.

24. The system of claim 23 wherein:

means are provided for generating a dither signal which is coupled to one of the transmit mixer and the first receiver mixer.

25. The system of claim 23 wherein:

the control means includes a digital computer system having stored spurious amplitude data for the system bandwidth and stored logic for selecting frequency modifications as a function of the system operating frequency and the stored spurious amplitude data to enable spurious signals to be sidestepped from receiver processing over the system bandwidth.

26. The system of claim 24 wherein:

the communication system is a radar system, the receiving and transmitting means are radar receiver and transmitting means, and the dither signal generating means includes a clutter track oscillator generating a clutter track signal which is coupled to the transmit mixer to enable blockage of clutter from radar receiver processing.

27. The radar system of claim 26 wherein:

a transmit frequency selector switch couples one of an LO1 frequency signal and an auxiliary signal from the frequency signal generating means to the transmit mixer; and the controlling means selectively controls the operation of the transmit frequency selector switch to sidestep spurious signals from receiver processing.

28. The radar system of claim 24 wherein:

the communication system is a radar system, the receiving and transmitting means are radar receiving and transmitting means, and the dither signal generating means includes a clutter track oscillator generating a clutter track signal which is coupled to the receiver first mixer to enable blockage of clutter from radar receiver processing.

29. The radar system of claim 28 wherein:

a clutter mixer to which an output of the clutter track oscillator is coupled;

an offset frequency generator subsystem having a plurality of offset frequency outputs coupled to the clutter mixer through a first selector switch;

a bank of clutter signal filters coupled to an output of the clutter mixer;

a second selector switch selectively coupling one of the clutter signal filter outputs to an LO1 mixer which has its output coupled to the receiver; and the controlling means selectively controls the operation of the first and second selector switches to sidestep spurious signals from receiver processing.

30. The system of claim 23 wherein:

a transmit frequency selector switch couples one of an LO1 frequency signal and an auxiliary signal from the frequency synthesizer system to the transmit mixer; and the controlling means selectively controls the operation of the transmit frequency selector switch to sidestep spurious signals from receiver processing.

31. The system of claim 23 wherein:

the receiving means includes a plurality of IF1 units operating with different IF1 frequencies and coupled to an output of the first mixer of the receiving means;

a first selector switch selectively couples outputs from the IF1 units to a second receiver mixer; and the controlling means selectively couples one of the IF1 units to the second receiver mixer through the first selector switch according to the system operating frequency and the stored spurious amplitude data to sidestep spurious signals in portions of the total system frequency operating bandwidth where spurious amplitudes are excessive and otherwise would interfere with quality reception.

32. The system of claim 31 wherein means are provided for generating a dither signal which is coupled to the transmit mixer.

33. The system of claim 32 wherein:

the communication system is a radar system, the receiving and transmitting means are radar receiving and transmitting systems, and the dither signal generating system includes a clutter track oscillator generating a clutter track signal which is coupled to the transmit mixer to enable blockage of clutter from radar receiver processing.

34. The radar system of claim 33 further including:

a plurality of clutter oscillators corresponding in number to the number of IF1 units and having respective operating frequencies equal to the IF1 frequencies of the respective IF1 units; and a second selector switch selectively coupling one of the clutter oscillators to the transmit mixer according to the IF1 unit selected for operation by the controlling means.

35. A method for operating a large bandwidth communication system having a transmitter and a receiver comprising the steps of:

operating the transmitter to transmit signals over a selectable frequency operating range;

operating the receiver to receiver the transmit signals through a first mixer which mixes an LO1 signal with the received transmit signals;

operating a first IF system in the receiver to process signals received from the first mixer;

generating frequency signals for application to at least a transmit mixer in the transmitter and to at least the first mixer in the receiver; and selecting and applying a modified frequency value for at least one of plural frequencies including that of the LO1 signal applied to the first mixer, that of a frequency signal applied to the transmit mixer, and an IF frequency of the first IF system, with the modified frequency value selected as a function of the system operating frequency and stored spurious amplitude data to sidestep spurious signals in portions of the total system frequency operating bandwidth where spurious amplitudes are excessive and otherwise would interfere with quality reception.

36. The method of claim 35 wherein the steps further include:

generating a dither signal which is coupled to one of the transmit mixer and the first receiver mixer.

37. The method of claim 36 wherein the communication system is a radar system, the receiver and transmitter systems are radar receiver and transmitter systems, and wherein the dither signal generating step includes generating a clutter track signal which is coupled to the transmit mixer to enable blockage of clutter from radar receiver processing.

38. The radar operating method of claim 37 wherein the steps further include:

selectively coupling one of an LO1 frequency signal and an auxiliary signal to the transmit mixer; and the control system selectively controlling the coupling step to sidestep spurious signals from receiver processing.

39. The operating method of claim 36 wherein the communication system is a radar system, the receiver and transmitter systems are radar receiver and transmitter systems, and wherein the dither signal generating includes generating a clutter track signal which is coupled to the receiver first mixer to enable blockage of clutter from radar receiver processing.

40. The radar operating method of claim 35 wherein frequency signal generating the step includes:

coupling a generated LO1 frequency signal and a generated auxiliary signal from the frequency through a transmit frequency selector switch to the transmit mixer; and selectively controlling the transmit frequency selector switch to sidestep spurious signals from receiver processing.

41. The operating method of claim 35 wherein the receiver system includes a plurality of IF1 units operating with different IF1 frequencies and coupled to an output of the receiver first mixer, and wherein the steps further include:

coupling outputs from the IF1 units through a first selector switch to a second receiver mixer; and selectively coupling one of the IF1 units to the second receiver mixer through the first selector switch according to the system operating frequency and the stored spurious amplitude data to sidestep spurious signals in portions of the total system frequency operating bandwidth where spurious amplitudes are excessive and otherwise would interfere with quality reception.

42. The method of claim 41 wherein the dither signal is coupled to the transmit mixer.

43. The method of claim 41 wherein:

the communication operating method is a radar operating method, the receiver and transmitter systems are radar receiver and transmitter systems, and a dither signal generating step includes generating a clutter track signal which is coupled to the transmit mixer to enable blockage of clutter from radar receiver processing.

* * * * *